US006614707B2

(12) United States Patent
Kato

(10) Patent No.: US 6,614,707 B2
(45) Date of Patent: Sep. 2, 2003

(54) POWER SUPPLY CIRCUIT STABLY SUPPLYING POWER SUPPLY POTENTIAL EVEN TO LOAD CONSUMING RAPIDLY CHANGING CURRENT AND SEMICONDUCTOR MEMORY DEVICE WITH SAME

(75) Inventor: Hiroshi Kato, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/157,184

(22) Filed: May 30, 2002

(65) Prior Publication Data

US 2002/0145412 A1 Oct. 10, 2002

Related U.S. Application Data

(62) Division of application No. 09/784,136, filed on Feb. 16, 2001, now Pat. No. 6,404,178.

(30) Foreign Application Priority Data

Aug. 8, 2000 (JP) ....................................... 2000-239598

(51) Int. Cl.$^7$ .................................................. G11C 7/00

(52) U.S. Cl. ................... 365/226; 365/227; 365/189.11

(58) Field of Search ................................ 365/226, 227, 365/189.11, 229, 189.09

(56) References Cited

U.S. PATENT DOCUMENTS

| | | | | |
|---|---|---|---|---|
| 5,194,762 A | | 3/1993 | Hara et al. | 323/284 |
| 5,901,102 A | * | 5/1999 | Furutani | 365/226 |
| 6,084,386 A | | 7/2000 | Takahashi et al. | |
| 6,097,180 A | | 8/2000 | Tsukude et al. | 323/313 |
| 6,272,055 B1 | * | 8/2001 | Hidaka et al. | 365/189.11 |
| 6,297,624 B1 | * | 10/2001 | Mitsui et al. | 365/226 |

FOREIGN PATENT DOCUMENTS

| | | |
|---|---|---|
| JP | 6-266452 | 9/1994 |

* cited by examiner

*Primary Examiner*—Shawn Riley
(74) *Attorney, Agent, or Firm*—McDermott, Will & Emery

(57) ABSTRACT

A power supply circuit according to the present invention includes: a potential difference amplifying circuit amplifying a potential difference between an internal power supply potential and a reference potential to output the amplified potential difference to a control node; a current supply transistor supplying a current according to a potential level of the control node to an internal power supply line; and a forced current supply control circuit forcibly performing current supply by the current supply transistor through adjustment of a potential level of the control node. The forced current supply control circuit begins forced current supply to the internal power supply line at the timing based on activation of a word line activation signal to be activated in advance of activation of a sense amplifier, which is a load.

11 Claims, 23 Drawing Sheets

POWER SUPPLY CIRCUIT STABLY SUPPLYING POWER SUPPLY POTENTIAL EVEN TO LOAD CONSUMING RAPIDLY CHANGING CURRENT AND SEMICONDUCTOR MEMORY DEVICE WITH SAME

This application is a divisional of application Ser. No. 09/784,136 filed Feb. 16, 2001 now U.S. Pat. No. 6,404,178.

BACKGROUND OF THE INVENTION

1. Field of the Invention

The present invention relates to a power supply circuit and more particularly, to a power supply circuit converting an external power supply potential into an internal power supply potential to supply the internal power supply potential to a load and a configuration of a semiconductor memory device with the same.

2. Description of the Background Art

A withstand voltage of an internal circuit of a semiconductor device has been reduced through progress in microfabrication according to increased requirement for a larger capacity of a semiconductor memory device. In order to cope with such a situation, in a semiconductor memory device, an external power supply potential, for example, of 5 V or 3.3 V is stepped down to a proper internal power supply potential (for example, 2.5 V, 2.0V or the like) by a power supply circuit provided internally (hereinafter also referred to as an internal power supply circuit). Such an internal power supply circuit is referred to as a voltage down converter (VDC) as well.

When an internal power supply potential generated by a power supply circuit is reduced to a value lower than a prescribed level, a group of internal circuits of a semiconductor memory device has a risk that neither of the internal circuits can perform a prescribed operation at a prescribed speed since the internal power supply potential is used by each of the internal circuits in the semiconductor memory device. On the other hand, when the internal power supply potential rises and exceeds a prescribed level, there arises a risk that not only does power consumption increase, but transistors miniaturized due to progress to higher integration are also electrically broken. Hence, the power supply circuit has to control a level of the internal power supply potential in a stable manner such that fluctuations in the internal power supply potential are confined within a prescribed range determined by specifications of the semiconductor memory device.

FIG. 31 is a circuit diagram representing a configuration of a prior art internal power supply circuit 500 having a typical configuration of VDC.

The internal power supply circuit 500 is a circuit for receiving an external power supply potential ext.Vdd from an external power supply line 510 to hold an internal power supply potential int.Vdd supplied to a load 550 at a reference voltage Vref.

Referring to FIG. 31, the internal power supply circuit 500 includes: an external power supply line 510 supplying an external power supply potential ext.Vdd; an internal power supply line 520 supplying an internal power supply potential int.Vdd; a potential difference amplifying circuit 530 amplifying and outputting a potential difference between the internal power supply potential int.Vdd and a reference potential Vref; a current supply transistor QD1 supplying a current Isup to the internal power supply line

520 from the external power supply line 510 according to an output of the potential difference amplifying circuit 530; and an stabilization capacitance 545 for suppressing fluctuations in potential level of the internal power supply line 520. The load 550 receives supply of the internal power supply potential int.Vdd from the internal power supply line 520 and consumes a load current Iload.

The potential difference amplifying circuit 530 includes P type MOS transistors QP1 and QP2, and N type MOS transistors QN1, QN2 and QN3 constituting a current mirror amplifier coupled between the external power supply line 510 and a ground line 540. The reference voltage Vref and the internal power supply potential int.Vdd are inputted to the respective gates of the transistors QN1 and QN2. The gates of the transistors QP1 and QP2 are coupled to a node Np. The transistor QN3 supplies an operating current of the current mirror amplifier in response to activation of a control signal ACT.

The transistors QP1, QP2, QN1, QN2 and QN3 are designed in such a manner to operate in respective saturation regions and thereby, the potential difference amplifying circuit 530 amplifies differentially a gate potential difference of the transistors QN1 and QN2 such that the gate potential difference is reflected on a potential level of a node Nd.

When an internal power supply potential int.Vdd is lower than the reference potential Vref, a potential level of the node Nd is shifted to the ground potential Vss side and in response to the shift, the current supply transistor QD1 supplies a current to the internal power supply line 520 from the external power supply line 510. On the other hand, when an internal power supply potential int.Vdd rises beyond the reference potential Vref, a potential level of the node Nd is shifted to the external power supply potential ext.Vdd side; therefore, the current supply transistor QD1 is turned off to stop current supply to the internal power supply line 520. With such operations, the internal power supply circuit 500 compensates for fluctuations in the internal power supply potential int.Vdd to hold the internal power supply potential int.Vdd at a level of the reference potential Vref.

However, various patterns exist in current consumed by the load 550 receiving supply of an internal power supply potential int.Vdd from the internal power supply line 520.

FIG. 32 is a timing chart representing operation of the internal power supply circuit corresponding to an example pattern of current consumption of the load 550. In FIG. 32, shown is a current waveform of a load consuming a small amount of current continuously. As a typical example load having such as current consumption pattern, there can be named a peripheral circuit such as a signal buffer used in a DRAM (Dynamic Random Access Memory).

Referring to FIG. 32, the internal power supply circuit is active during a period when a control signal ACT is active. Since a load current Iload of the load 550 is continuously consumed, no much difference occurs between an instant value I1 and an average value of the load current. Hence, a drop ΔV1 in level of an internal power supply potential int.Vdd can be suppressed to a comparatively low level by the action of the stabilization capacitance 545.

Therefore, the current supply transistor QD1 can follow gradual reduction in potential level occurring on the internal power supply line 520 by the action of the current Isup controlled by the potential difference amplifying circuit 530 and supplied to the internal power supply line 520. As a result, the internal power supply potential int.Vdd never decreases lower than the reference potential by a great difference. Consequently, there is a low possibility to produce a problem such as malfunction in the internal circuitry, which is a load receiving supply of the internal power supply potential.

FIG. 33 is a timing chart representing operation of an internal power supply circuit corresponding to another example pattern of load current consumption. In FIG. 33, shown is a current waveform of a load consuming a load current Iload with a large amplitude, supplied intermittently. As a typical example of a load with such a current consumption pattern, there can be named a sense amplifier used in a DRAM.

In a case of FIG. 33 as well, the internal power supply circuit is active during a period when a control signal ACT is active. However, in a case of a load current with a large amount, supplied intermittently, a large difference occurs between an instant value I2 and an average value of a load current; therefore, an internal power supply potential int.Vdd cannot be sufficiently held by the action of a supply current Isup of the current supply transistor QD1 controlled by the potential difference amplifying circuit 530. As a result, a drop ΔV2 of the internal power supply potential is rendered larger. With a large value in the drop ΔV2, there arises a possibility to deteriorate operation of an internal circuit, which is a load receiving supply of an internal power supply potential.

When suppression of a drop in level of an internal power supply potential int.Vdd is intended by use of the stabilization capacitance 545 in the presence of such a rapidly changing load current with a large amplitude, the capacitance 545 has to be of a large value, thereby causing a new problem of increase in chip area.

A technique is disclosed, for example, in Japanese Patent Laying-Open No. 6-266452 for maintaining an internal power supply potential in a stable manner without largely depending on a stabilization capacitance while coping with such a rapidly changing current consumption, which technique specifies an internal power supply circuit forcibly supplying a current onto an internal power supply line in a timing matching with current consumption.

In an internal power supply circuit applied with such a technique, it is important that timing at which to perform forced current supply is properly adjusted according to current consumption timing in a load. When timing at which to start forced current supply is later than timing at which to start of current consumption by a load, a large drop in internal power supply potential takes place, while on the other hand, when timing at which to stop forced current supply is too late, the internal power supply line 520 is overcharged to raise the internal power supply potential in excess, which leads even to a risk to cause inconvenience to the contrary.

SUMMARY OF THE INVENTION

It is an object of the present invention to provide a power supply circuit capable of stably maintaining an internal power supply potential even to a load consuming a rapidly changing current and a configuration of a semiconductor memory device with the same circuit.

The present invention will be summarized as follows:

An aspect of the present invention is directed to a power supply circuit converting an external power supply potential into an internal power supply potential to supply the internal power supply potential to a load circuit performing a prescribed operation in response to activation of a control signal, and including: an external power supply line; an internal power supply line; a potential difference amplifying circuit; a current supply circuit; and a forced current supply control circuit. The external power supply line supplies an external power supply potential. The internal power supply line, coupled to the load circuit, supplies an internal power supply potential. The potential difference amplifying circuit amplifies a potential level difference between the internal power supply potential and a reference potential to output the amplified potential level difference to a control node. The current supply circuit supplies a supply current amount according to a potential level of the control node to the internal power supply line from the external power supply line. The forced current supply control circuit forcibly performs current supply to the internal power supply line from the external power supply line, regardless of the potential level difference, according to an auxiliary control signal activated for performing a preliminary operation performed in advance of said prescribed operation and said control signal. The forced current supply control circuit forcibly performs current supply during a prescribed period from a first time point determined in response to activation of the auxiliary control signal till a second time point determined in response to activation of the control signal.

A main advantage of the present invention is, accordingly, that a current can be forcibly supplied to the internal power supply line, before a prescribed operation gets started in a load circuit to consume a current, according to a control signal corresponding to a preliminary operation performed in advance of the prescribed operation. As a result, even when a consumed current by the load circuit rapidly increases to a large amount, a drop in internal power supply potential is suppressed and the prescribed operation of the load circuit can be performed with no trouble, in a situation where a large stabilization capacitance is not provided on the internal power supply line.

Another aspect of the present invention is directed to a semiconductor memory device including: a memory cell array; a plurality of word lines; a plurality of bit line pairs; a plurality of sense amplifier circuits; and a power supply circuit. The memory cell array includes a plurality of memory cells arranged in a matrix pattern. The plurality of word lines are provided corresponding to respective rows of the memory cells and at least one of the plurality of word lines is selectively activated in response to activation of a first control signal. The plurality of bit line pairs are provided corresponding to respective columns of the memory cells and each bit line pair transmits data held in a memory cell corresponding to an activated word line. The plurality of sense amplifier circuits are provided corresponding to the respective plurality of bit line pairs and each sense amplifier circuit amplifies a potential level difference occurring between bit lines constituting a corresponding one of the plurality of bit line pairs in response to a second control signal. The power supply circuit converts an external power supply potential into an internal power supply potential. The power supply circuit includes: an external power supply line supplying an external power supply potential; an internal power supply line coupled, at least, to a sense amplifier to supply an internal power supply potential to the sense amplifier; a potential difference amplifying circuit amplifying a potential level difference between the internal power supply potential and a reference potential to supply the amplified potential level difference to a control node; a current supply circuit for supplying a supply current amount according to a potential level of the control node to the internal power supply line from the external power supply line; and a forced current supply control circuit for forcibly performing current supply to the internal power supply line from the external power supply line, regardless of the potential level difference, according to the first and second control signals. The forced current supply control circuit forcibly performs current supply during a prescribed period from a first time point determined in response to activation of the first control signal till a second time point determined in response to activation of the second control signal.

Hence, a current can be forcibly supplied to an internal power supply line before a sense amplifier is activated and a current is consumed. As a result, a drop in internal power supply potential is suppressed and a data read operation by a sense amplifier circuit can be performed at high speed without providing a large stabilization capacitance onto the internal power supply line while coping with consumption of a rapidly changing, large amount of current by a sense amplifier circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Detailed description will be given of embodiments of the present invention below with reference to the accompanying drawings. Please note that the same reference marks in the figures indicate the same or corresponding parts.

First Embodiment

Figure 1:
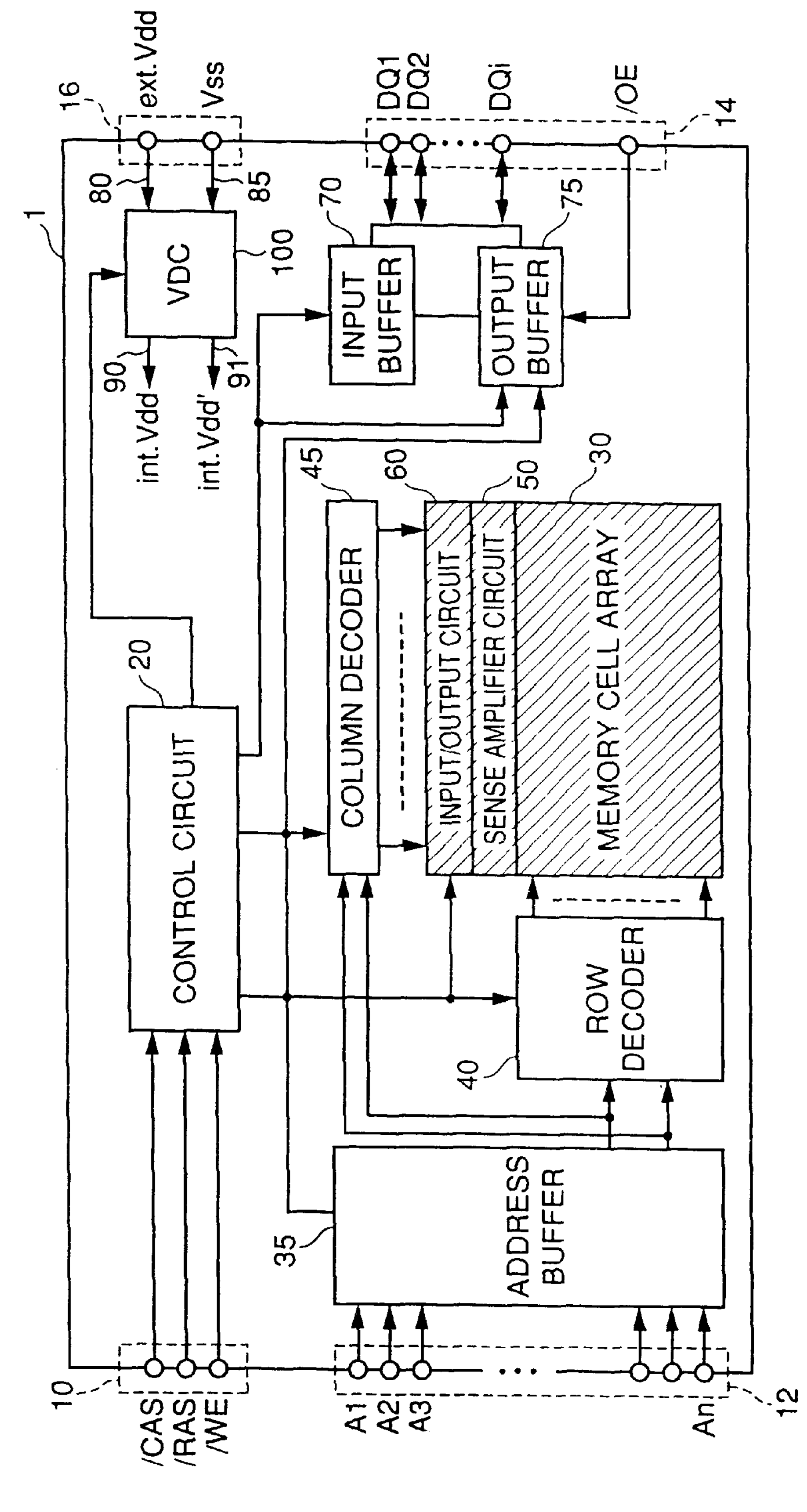
FIG. 1 is a schematic block diagram representing the entire configuration of a semiconductor memory device 1 with an internal power supply circuit according to a first embodiment of the present invention.

Referring to FIG. 1, a semiconductor memory device 1 with an internal power supply circuit according to the first embodiment of the present invention includes: a control signal input terminal 10 receiving a column address strobe signal /CAS, a row address strobe signal/RAS, and a write enable signal /WE; an address input terminal 12 receiving an address signal A1 to An (n is a natural number); a data input/output terminal 14 receiving/supplying input/output datas DQ1 to DQi (i is a natural number) and an output enable signal /OE; and a power supply input terminal 16 receiving inputs of an external power supply potential ext.Vdd and a ground potential Vss.

The semiconductor memory device 1 further includes: a control circuit 20 controlling the entire operations of the semiconductor memory device 1 according to control signals inputted to the control signal input terminal 10; a memory cell array 30 having a plurality of memory cells arranged in a matrix pattern; an address buffer 35 for specifying a memory cell corresponding to an address signal in the memory cell array; a row decoder 40; and a column decoder 45.

In the memory cell array 30, word lines are provided to respective rows of memory cells and bit line pairs are provided to respective columns of memory cells. The memory cells are located at respective intersections of the word lines and the bit lines.

The address buffer 35 supplies an address signal supplied externally to the row decoder and the column decoder selectively. The row decoder 40 selectively drives at least one of a plurality of word lines in response to a row address signal supplied from the address buffer 35. The column decoder 45 selects one of a plurality of bit line pairs in response to a column address signal supplied from the address buffer. The sense amplifier circuit 50 includes a plurality of sense amplifiers provided corresponding to the respective bit line pairs. Each sense amplifier amplifies a potential difference occurring between bit lines of a corresponding pair.

The input/output circuit 60 supplies a potential level of a bit line pair selected by a column decoder to the output buffer 75. The output buffer 75 amplifies a potential level supplied and outputs the amplified potential level as output data DQ1 to DQi to outside. The input buffer 70 amplifies the input data DQ1 to DQi when the input buffer 70 is supplied with write data from outside. The input/output circuit 60 supplies an input data amplified by the input buffer 70 to a bit line pair selected by the column decoder 45.

/CAS, /RAS and /WE inputted to the control signal input terminal 10 are supplied to the control circuit 20 and the control circuit 20 determines timings of operations of respective all circuits of the semiconductor memory device 1 in a read operation and a write operation.

The semiconductor memory device 1 further includes: an internal power supply circuit 100 outputting an internal power supply potential int.Vdd based on an external power supply potential ext.Vdd inputted to the power supply input terminal 16 and the ground potential Vss. In the semiconductor memory device 1, the external power supply potential ext.Vdd and the ground potential Vss are supplied by an external power supply line 80 and an ground line 85.

Figure 32:
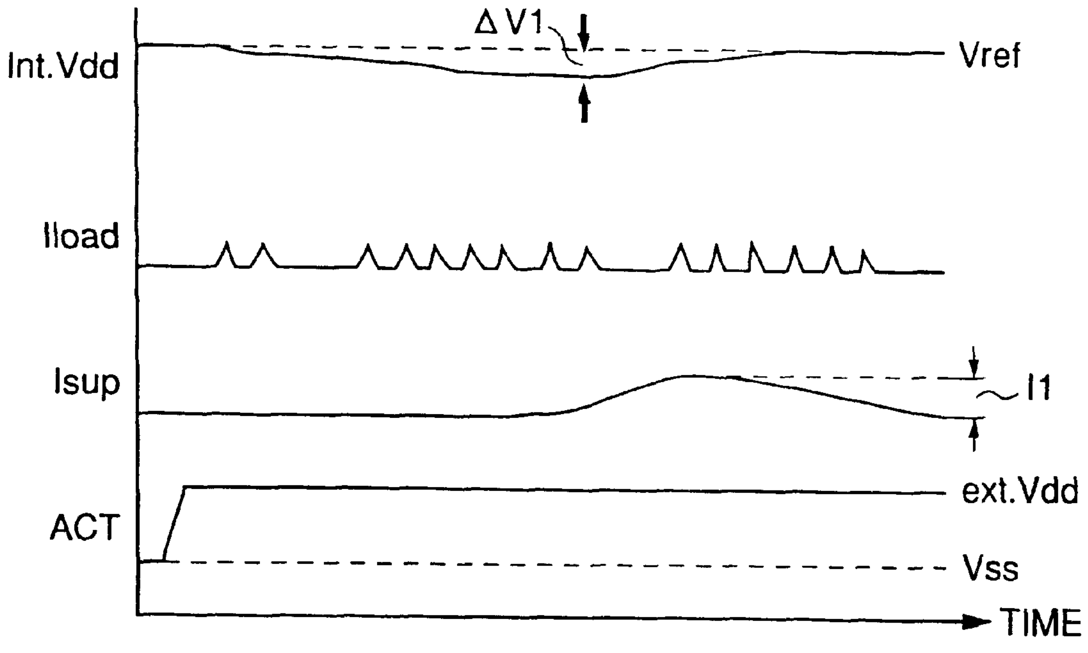
FIG. 32 PRIOR ART
FIG. 32 is a timing chart representing operations of an internal power supply circuit corresponding to an example current consumption pattern of a load.
Figure 33:
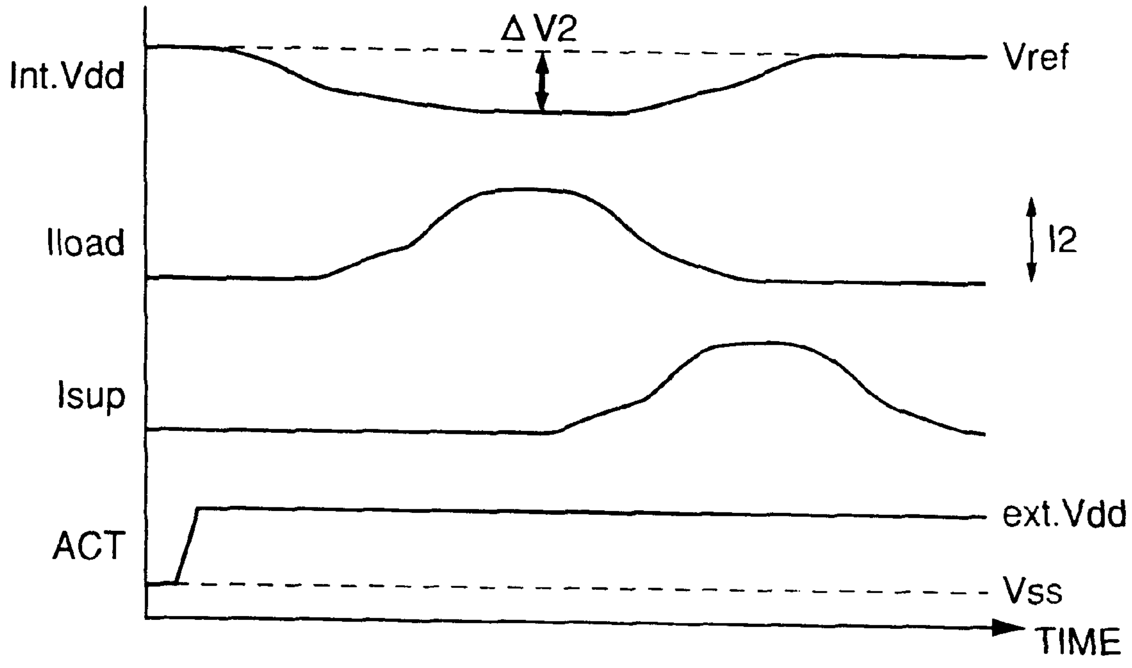
FIG. 33 PRIOR ART
FIG. 33 is a timing chart representing operations of an internal power supply circuit corresponding to another example current consumption pattern of a load.

In general, a load current consumed in other peripheral circuits than the memory cell array 30, the sense amplifier circuit 50 and the input/output circuit 60 is continuous and of a small amplitude as shown in FIG. 32. On the other hand, a load current consumed in the memory cell array 30, the sense amplifier circuit 50 and the input/output circuit 60 (the three parts are also collectively referred to the memory array hereinafter) is intermittent and of a large amplitude as shown in FIG. 33 in performing a data amplifying operation by the sense amplifier circuit 50 in response to a memory access.

Accordingly, a peripheral circuit power supply and a memory array power supply are independently provided in many cases. In the first embodiment of the present invention, independent VDCs and internal power supply lines are provided for use in the peripheral circuitry and the memory array, respectively.

Description will be especially given of a part corresponding to the memory array power supply within the internal power supply circuit 100 in the first embodiment of the present invention. Supply of an internal power supply potential int.Vdd to the memory array is performed by an internal power supply line 90.

On the other hand, supply of the internal power supply potential int.Vdd to the peripheral circuitry is performed by an internal power supply line 91. Although detailed description is not given of the VDC (internal power supply circuit) generating an internal power supply potential supplied to the peripheral circuitry, the VDC may be one (internal power supply circuit) with a general configuration in the prior art, shown in FIG. 31 for example.

It should be appreciated that while in FIG. 1, the semiconductor memory device 1 is shown as an asynchronous DRAM, the device 1 may be a synchronous DRAM (SDRAM). In the latter case, a clock signal CLK, a clock enable signal CLKE, a chip select signal /CS and the like are further inputted to the control circuit 20 and the semiconductor memory device 1 operates in synchronism with the clock signal CLK.

Figure 2:
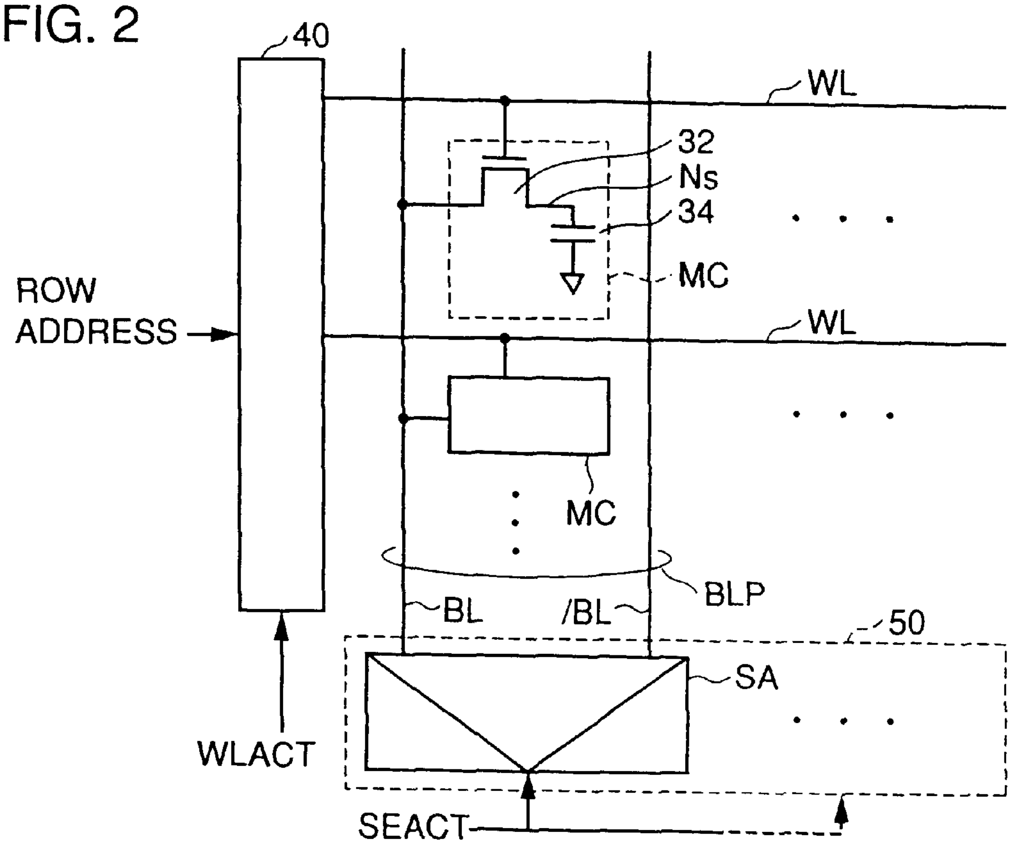
FIG. 2 is a block diagram describing a configuration of a memory cell array and a sense amplifier circuit.

Referring to FIG. 2, a memory cell array 30 has a plurality of memory cells MC arranged in a matrix pattern. A memory cell MC includes an access transistor 32 and a data holding capacitor 34. The access transistor 32 is electrically coupled between a bit line BL being one of a bit line pair provided to each memory cell column and a data storage node Ns. The gate of the access transistor 32 is coupled to a word line WL provided to each memory cell row.

The decoder 40 activates a word line WL corresponding to a row address signal in response to activation of a word line activation signal WLACT. A bit line BL and a data storage node Ns are coupled to each other in each memory cell corresponding to a word line in an active state to perform data read/write on the memory cell. A charge transmitted to the data storage node Ns is held by the data holding capacitor 34 of each memory cell corresponding to a word line in an inactive state.

The other bit line /BL of the bit line pair BLP is provided in order to transmit a data complementary to a data on the nit line BL. The sense amplifier circuit 50 has sense amplifiers SA provided corresponding to respective bit line pairs BLP.

A sense amplifier SA amplifies a potential difference occurring between bit lines BL and /BL, which constitute a corresponding bit line pair, in response to activation of a sense amplifier activation signal SEACT.

Figure 3:
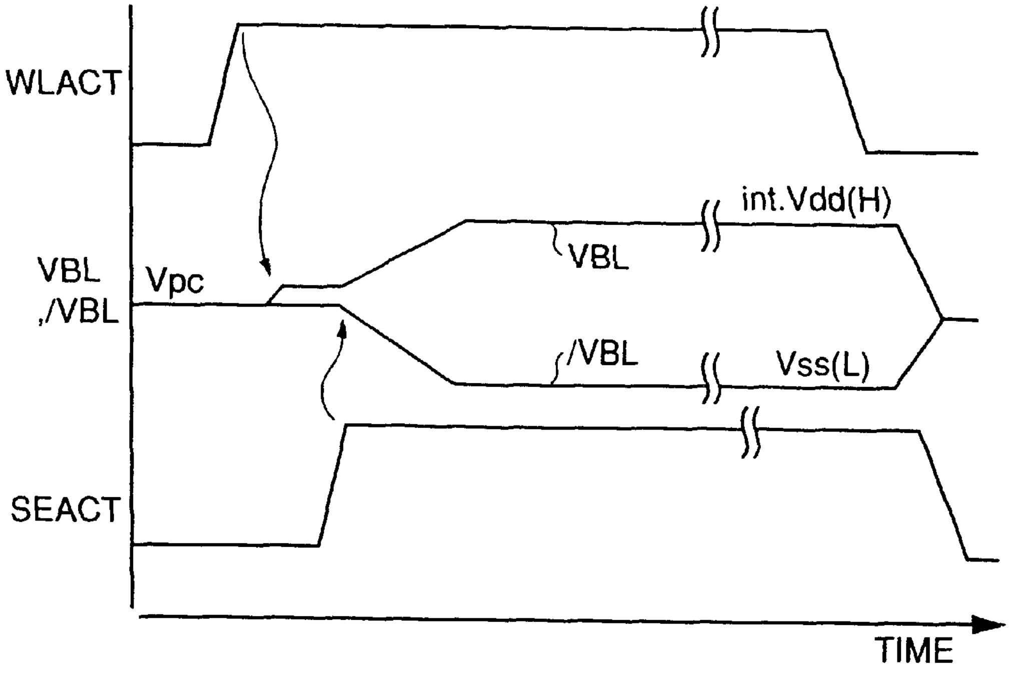
FIG. 3 is a timing chart describing operations accompanying activation of a word line and a sense amplifier in memory access.

Referring to FIG. 3, the row decoder 40 selectively activates a word line WL corresponding to a row address signal in response to activation (H level) of the word line activation signal WLACT. When a word line WL is activated, then in each memory cell MC belonging to a corresponding memory cell row, the access transistor 32 is turned on and thereby the bit line BL and the data storage node Ns are connected to each other. By doing so, a potential of the bit line BL rises or falls above or below a precharge level Vpc according to a data level held on the data storage node Ns.

In FIG. 3, shown is a situation where a H level data is held on the data storage node Ns. In this situation, a potential VBL of the bit line BL rises slightly according to turn-on of the access transistor 32. On the other hand, a potential level of the bit line /BL remains unchanged. At this point, when a sense amplifier activation signal SEACT is activated, the sense amplifier SE performs amplification of a potential difference occurring between the bit lines.

Hence, in the situation of FIG. 3, the potential VBL of the bit line BL rises to an internal power supply potential int.Vdd corresponding to a H level of data. On the other hand, a potential /VBL of the complementary bit line /BL falls to the ground potential Vss corresponding to a L level of data. In such a way, an amplifying operation of data stored in each memory cell is performed in response to activation of a word line.

In the semiconductor memory device, a configuration is adopted that in a one time row selecting operation, datas of all memory cells connected to the same word line are read out onto a bit line pair; therefore, many of sense amplifiers operate simultaneously. Accordingly, in operation of the sense amplifier circuits, a large amount of current is consumed in a short time length to temporarily reduce a potential level of the internal power supply potential int.Vdd. This phenomenon hinders swift amplification of a small potential level difference occurring in a bit line pair BLP, thereby causing a risk of decrease in an operating speed.

Figure 4:
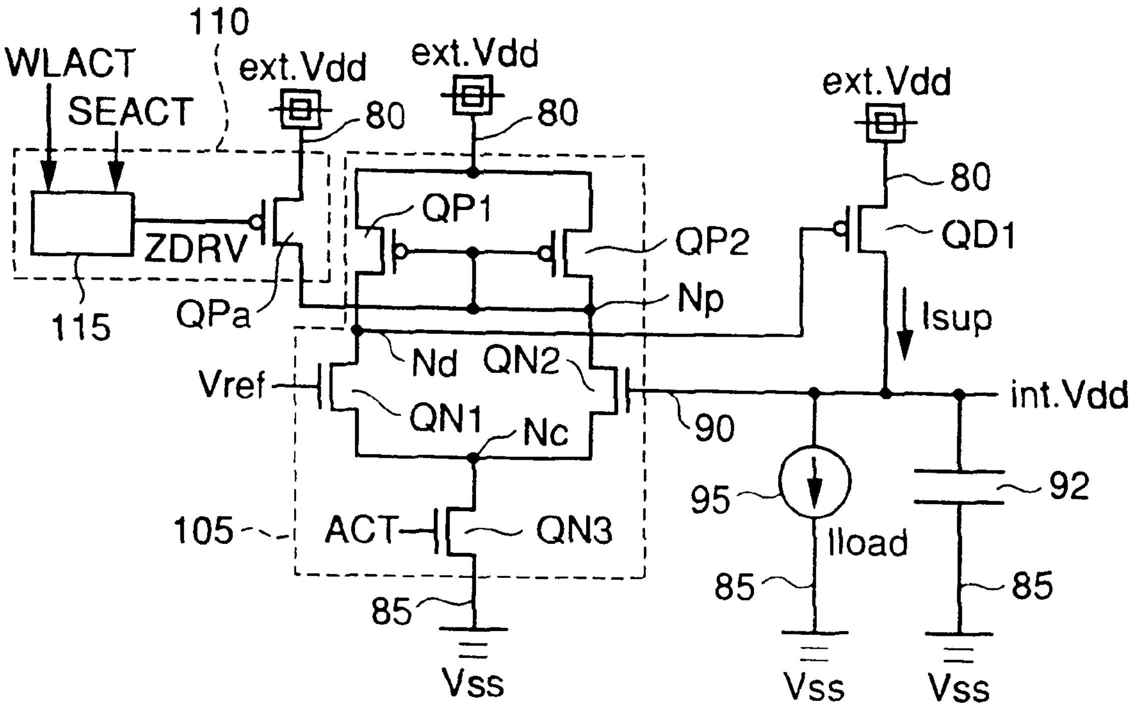
FIG. 4 is a circuit diagram representing a configuration of the internal power supply circuit according a first embodiment.

Referring to FIG. 4, the internal power supply circuit 100 according to the first embodiment includes: the external power supply line 80 supplying an external power supply potential ext.Vdd; the internal power supply line 90 supplying an internal power supply potential int.Vdd; a potential difference amplifying circuit 105, coupled between the external power supply line 80 and the ground line 85, and amplifying and outputting a potential difference between the internal power supply potential int.Vdd and the reference potential Vref; a current supply transistor QD1 supplying a current Isup to the internal power supply line 90 from the external power supply line 80 according to an output of the potential difference amplifier circuit 105; and a stabilization capacitance 92 for suppressing fluctuations in potential level of the internal power supply line 90. A load 95 receives supply of the internal power supply potential int.Vdd from the internal power supply line 90 and consumes a load current Iload. The load 95 corresponds to, for example, the sense amplifier circuit 50 shown in FIG. 1.

Figure 31:
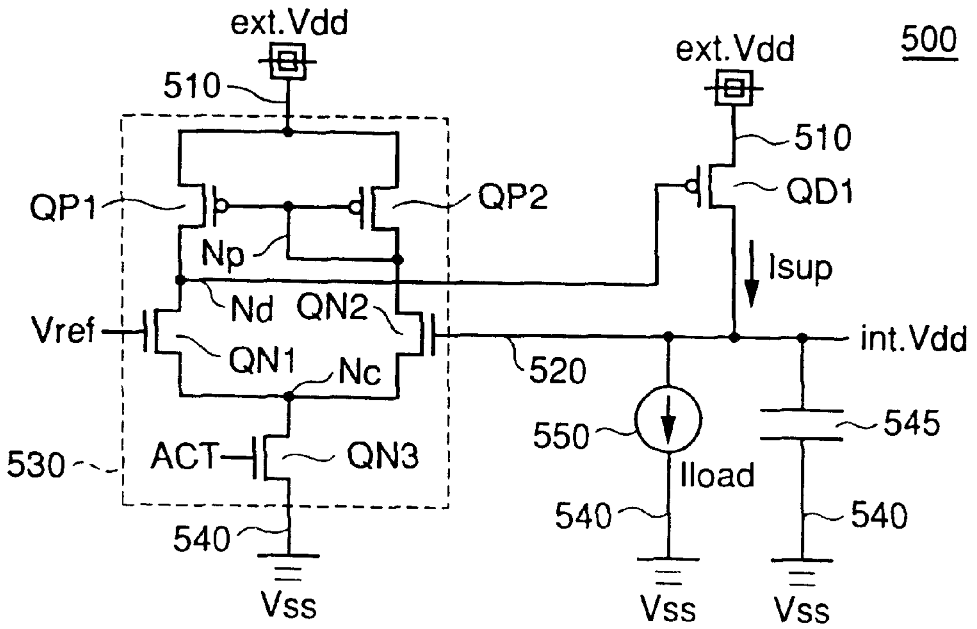
FIG. 31 PRIOR ART
FIG. 31 is a circuit diagram representing a prior art internal power supply circuit with a typical configuration of VDC.

The above described configuration of a part of the internal power supply circuit is similar to the configuration of the prior art VDC shown in FIG. 31.

The potential difference amplifying circuit 105 has a configuration similar to the potential difference amplifying circuit 530 described in FIG. 31. Consequently, in the potential difference amplifying circuit 105, an operating current supplied by a transistor QN3 is divided into a current flowing through a node Nd and a current flowing through a node Np according to a gate potential difference of transistors QN1 and QN2. As a result, the gate potential difference between the transistors QN1 and QN2 is produced on the node Nd in an amplified value thereof The node Nd is coupled to the gate of the current supply transistor QD1.

Hence, the current supply transistor QD1 supplies a current to the internal power supply line 90 from the external power supply line 80 when a potential level int.Vdd of the internal power supply line 90 is lower than the reference potential Vref. On the other hand, the current supply transistor QD1 is turned off and current supply to the internal power supply line 90 from the external power supply line 80 is ceased when the internal power supply potential int.Vdd is higher than the reference potential Vref The internal power supply circuit 100 further includes: a forced current supply control circuit 110 for forcibly performing current supply to the internal power supply line 90 from the external power supply line 80 regardless of a potential difference between the internal power supply potential int.Vdd and the reference potential Vref during a prescribed period.

The forced current supply control circuit 110 includes: an internal power supply control circuit 115 for controlling a period of forced current supply to the internal power supply line 90; and a P type MOS transistor QPa, coupled between the external power supply line 80 and the node Np, and receiving a forced current supply control signal ZDRV generated by the internal power supply control 115 at the gate thereof.

The internal power supply control circuit 115 activates the forced current supply control signal ZDRV to L level (the ground potential Vss) according to timing of current consumption of the load 95. The transistor QPa supplies a current to the node Np from the external power supply line 80 in response to activation of the forced current supply control signal ZDRV. With the current supply to the node Np, a potential level of the node Np rises, while a potential level of the node Nd falls, which receives one of portions of the operating current divided between the nodes Np and Nd. As a result, the supply current Isup from the current supply transistor QD1 increases.

Hence, in the internal power supply circuit 100, current supply to the internal power supply line 90 can be forcibly performed regardless of an internal power supply potential int.Vdd in response to activation of the forced current supply control signal ZDRV.

Figure 5:
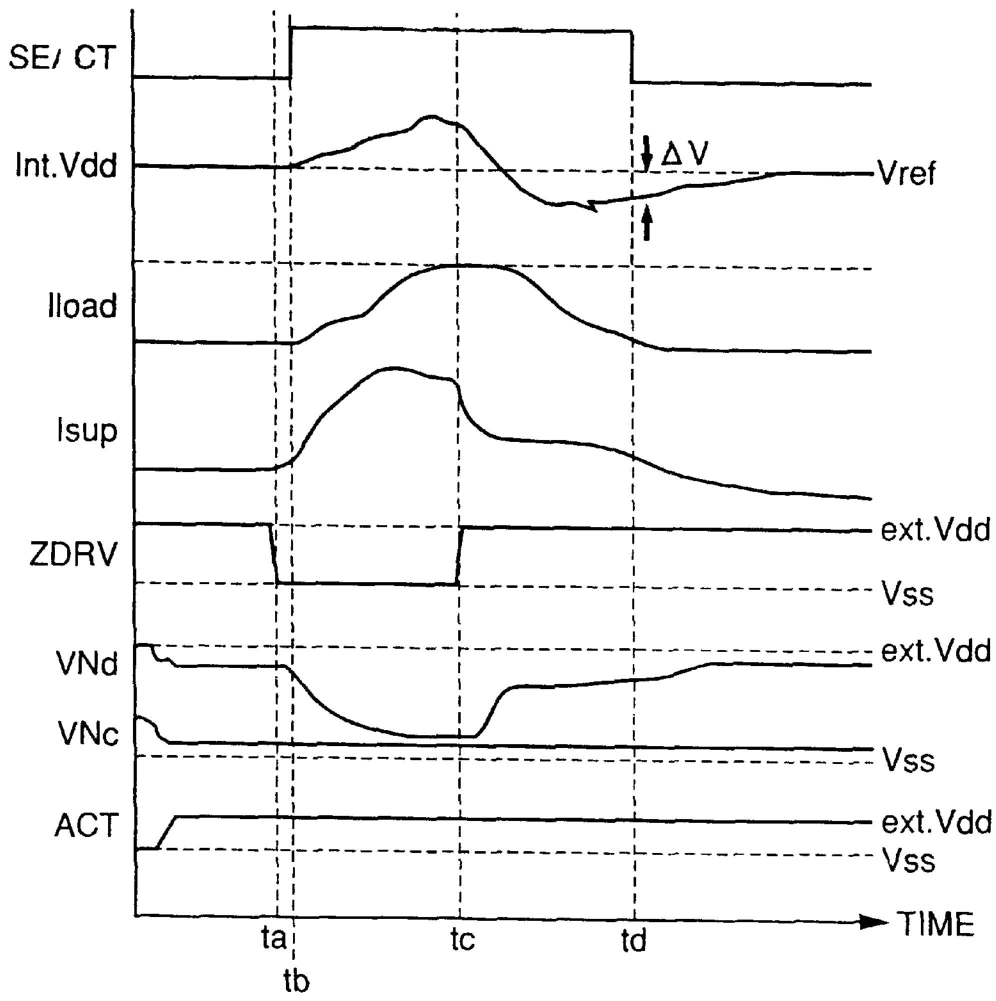
FIG. 5 is a timing chart describing operations of the internal power supply circuit according to a first embodiment.

Referring to FIG. 5, an operating current of the potential difference amplifying circuit 105 is supplied by reduction in potential level VNc of a node Nc close to the ground potential Vss in response to activation of a control signal ACT. With supply of the operating current, the internal power supply circuit 100 controls a current amount Isup supplied by the current supply transistor QD1 based on a comparison result between the internal power supply potential int.Vcc and the reference potential Vref.

Next, a forced current supply control signal ZDRV is activated to L level (the ground potential Vss) at a time point ta earlier than the timing at which current consumption gets started in the load (for example, a sense amplifier SA). In response to the activation, a current is forcibly supplied onto the node Np; therefore, a potential level VNd of the node Nd begins to fall to the contrary. Accordingly, a gate potential of the current supply transistor QD1 is reduced to perform current supply to the internal power supply line 90 from the external power supply line 80.

Consumption of a load current Iload gets started at a time point tb in response to activation of a control signal (for example, a sense amplifier activation signal SEACT). However, a drop in the internal power supply potential Int.Vdd can be prevented from occurring, without great dependence on a value of a stabilization capacitance, under influence of a supply current Isup supplied in advance excessively to the internal power supply line 90 in a forced manner.

A forced current supply control signal ZDRV is inactivated to H level (the external power supply potential ext.Vdd) at a time point tc before the current consumption in the load is terminated. Furthermore, when the control signal (for example, a sense amplifier activation signal SEACT) is inactivated at a time point td, the current consuming operation in the load is perfectly terminated. It should be appreciated that when the load is a sense amplifier, a consumed current Iload reaches its peak in a comparatively early period after activation of the control signal SEACT and the consumed current remains small after the peak. The timing at which the forced current supply control signal ZDRV is inactivated has only to be set in consideration of a pattern of a consumed current waveform of such a load.

Since forced current supply to the node Np is ceased at and after the time point tc, a current amount Isup supplied by the current supply transistor QD1 is controlled based on a comparison result between potential levels of an internal power supply potential int.Vcc and the reference voltage Vref similar to the way of control at and before the time point ta. In such a way, by ceasing forced current supply to the internal power supply line 90 before current consumption by the load is terminated, the internal power supply line is prevented from being overcharged, thereby enabling prevention of excessive increase in the internal power supply potential int.Vdd.

As described above, it is very important, in the internal power circuit 100, to set an active period of the forced current supply control signal ZDRV controlling the timing at which to perform forced current supply to the internal power supply line 90.

Next, detailed description will be given of activation timing of the forced current supply control signal ZDRV.

Figure 6:
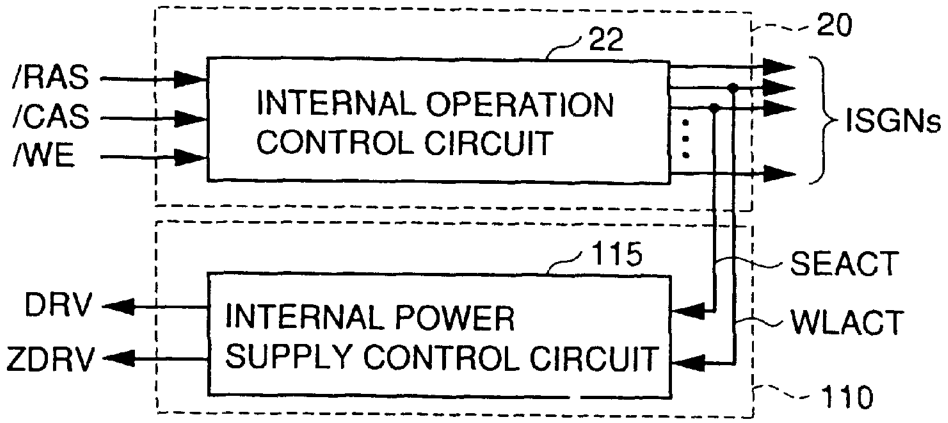
FIG. 6 is a block diagram representing an input/output relationship of an internal power supply control circuit.

Referring to FIG. 6, the control circuit 20 includes an internal operation control circuit 22 for controlling operation timings of internal circuits of the semiconductor memory device 1. The internal operation control circuit 22 generates a group of control signals ISGNs for performing operations such as a read/write operation of data in response to control signals /CAS, /RAS and /WE inputted to the control signal input terminal 10 to supply the group of control signals ISGNs to the respective internal circuits. The control signal group includes the word line activation signal WLACT and the sense amplifier activation signal SEACT described in FIG. 3, and associated with a sense amplifying operation.

The internal power supply control circuit 115 included in the forced current supply control circuit 110 receives a word line activation signal WLACT and a sense amplifier activation signal SEACT to generate forced current supply control signals DRV and ZDRV for controlling the internal power supply circuit 100. The forced current supply control signals DRV and ZDRV are active at H level (the external power supply potential ext.Vdd) and L level (the ground potential Vss), respectively, in a period in which forced current supply to the internal power supply line is performed.

Figure 7:
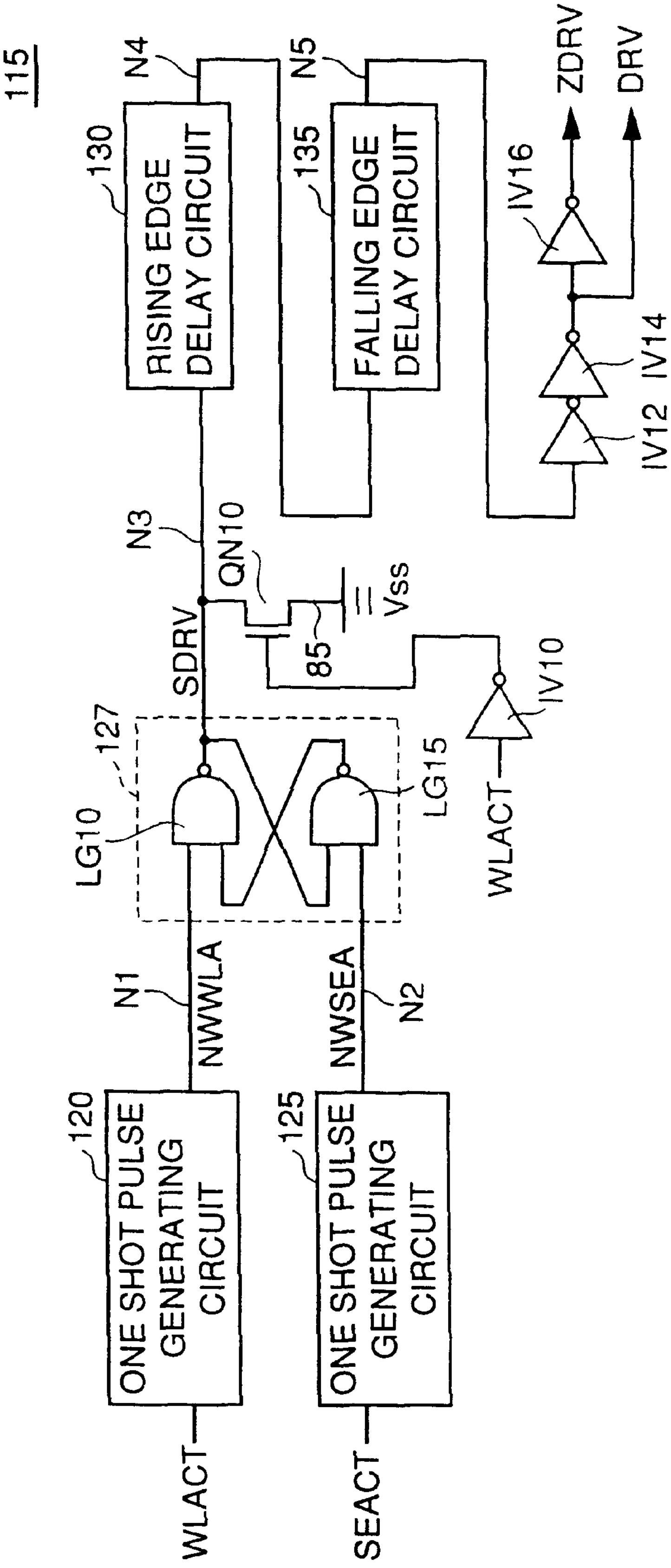
FIG. 7 is a block diagram representing a configuration of an internal power supply control circuit.

Referring to FIG. 7, the internal power supply control circuit 115 includes: a one shot pulse generating circuit 120 outputting a one shot pulse signal NWWLA activated to L level in response to activation of a word line activation signal WLACT to a node N1; a one shot pulse generating circuit 125 generating a one shot pulse signal NWSEA activated to L level in response to a sense amplifier activation signal SEACT to a node N2; and logic gates LG10 and LG15 constituting a flip flop 127 operating with the one shot pulse signals NWWLA and NWSEA as a set input and a reset input, respectively.

The one shot pulse signals NWWLA and NWSEA are each activated in the form of one shot when the word line activation signal WLACT and the sense amplifier activation signal SEACT are newly activated. The flip flop 127 generates a control signal SDRV onto a node N3. The control signal SDRV is activated to H level in response to each activation (L level) of the one shot pulse NWWLA, that is each activation of the word line activation signal WLACT. On the other hand, the control signal SDRV is reset and inactivated to L level in response to each activation (L level) of the one shot pulse signal NWSEA, that is each activation of the sense amplifier activation signal SEACT.

The internal power supply control circuit 115 includes: a rising edge delay circuit 130 connected between nodes N3 and N4; and a falling edge delay circuit 135 connected between the node N4 and a node N5. The rising edge delay circuit 130 delays the rising edge of the control signal SDRV (transition from L level to H level) and transmits the signal. Likewise, the falling edge delay circuit 135 delays the falling edge of the control signal SDRV (transition from H level to L level) and transmits the signal.

Figure 8:
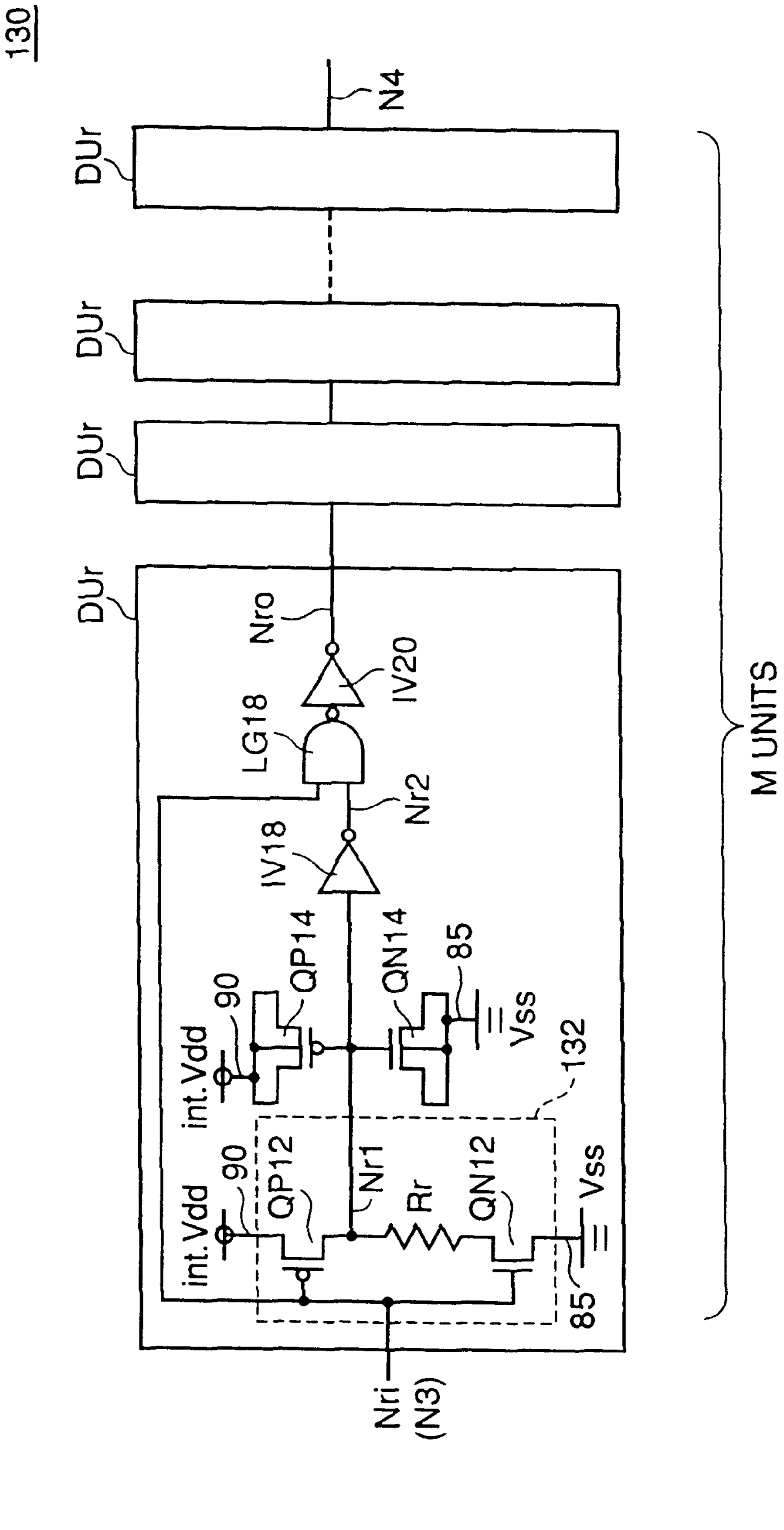
FIG. 8 is a circuit diagram representing a configuration of a rising edge delay circuit.

Referring to FIG. 8, the rising edge delay circuit 130 includes M delay units DUr (M is a natural number) connected in series to each other. Each delay units DUr delays the rising edge of a signal inputted to an input node Nri and transmits the signal to an output node Nro. The input node Nri of each delay unit DUr at the first stage is coupled to the node N3. The output node Nro of a delay unit DUr at the last stage is coupled to the node N4.

A delay unit DUr includes: a P type MOS transistor QP12, an N type MOS transistor QN12 and a delay resistance Rr, constituting an inverter 132 inverting a signal level of an input node Nri to transmit the signal to the node Nr1; and a P type MOS transistor QP14 and an N type MOS transistor QN14, constituting a delay capacitance.

The delay units DUr further includes: an inverter IV18 inverting a signal level of the node Nr1 to transmit the signal to the node Nr2; a logic gate 18 outputting the result of a NAND logic operation between the nodes Nri and Nr2; and an inverter IV20 inverting an output of the logic gate LG18 to transmit the output to the output node Nro.

Both signal levels of the input nodes Nri and Nr2 have to change to H levels in order that a signal level of the output node Nro of the delay unit DUr changes from L level to H level when a signal level of the input node Nri rises from L level to H level. Herein, transition of a potential of the node Nr2 to H level is affected by the transistors QP12 and QN12 acting as a delay resistance Rr and a delay capacitance.

On the other hand, when a signal level of the input node Nri falls from H level to L level, a signal level of the output node Nro changes to L level if a signal level of one of the input nodes Nri and Nr2 changes to L level.

Accordingly, the delay unit DUr transmits a signal to the input node Nri without delaying the falling edge of the signal but with delaying only the rising edge of the signal by a delay time produced by the transistors QP12 and QN12 acting as the resistance element R1 and a delay capacitance.

Consequently, by controlling values of delay resistance and delay capacitance, and the number M of the delay units, a delay time ΔTr applied to the rising edge of the control signal SDRV can be set.

Figure 9:
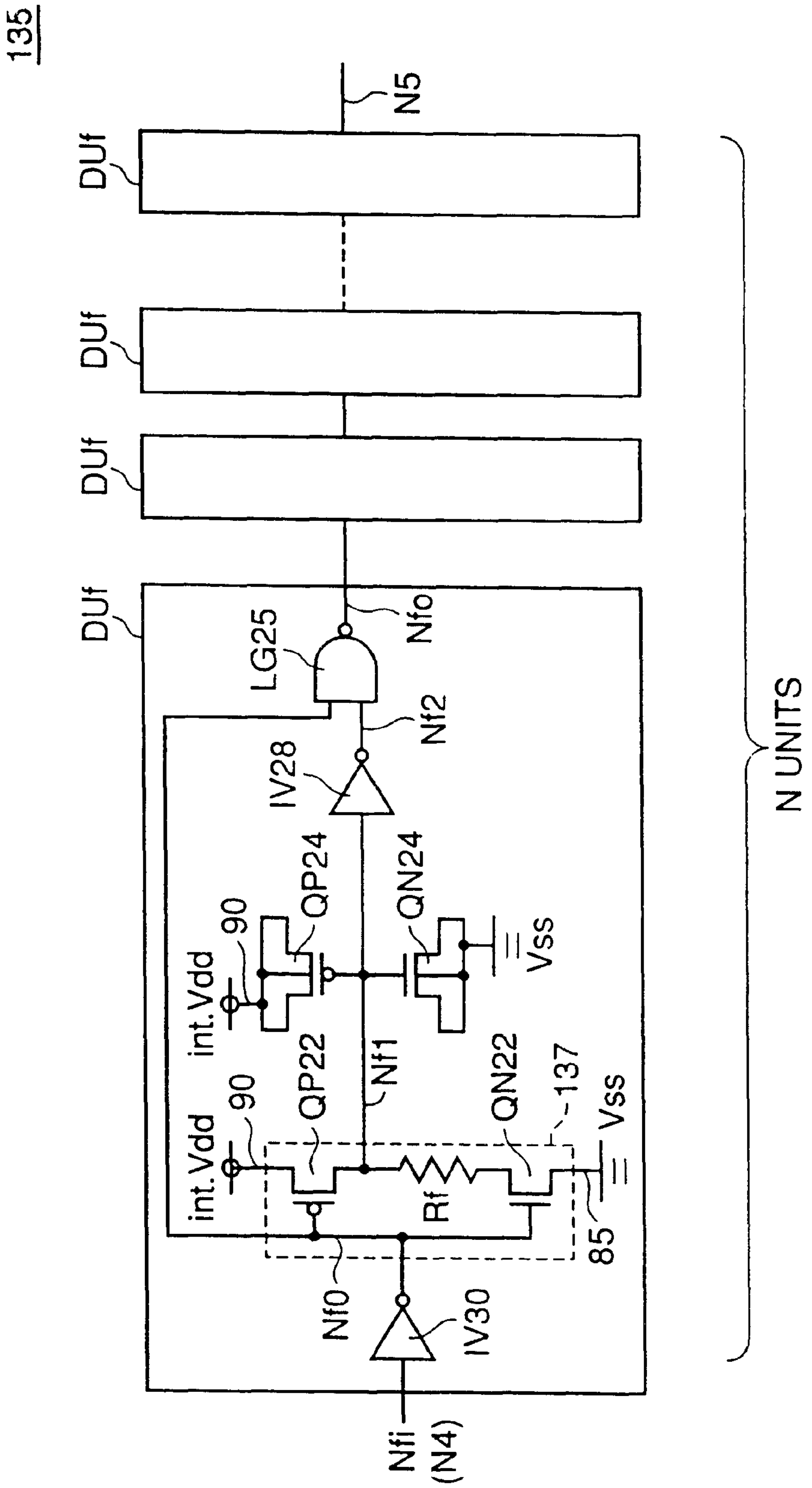
FIG. 9 is a circuit diagram representing a configuration of a falling edge delay circuit.

Referring to FIG. 9, the falling edge delay circuit 135 includes: N delay units (N is a natural number) DUf connected in series to each other. Each delay unit DUf delays the rising edge of a signal having been inputted to an input node Nfi to transmit the signal to an output node Nfo. The input node Nfi at the first stage of each delay unit is coupled to the node N4. An output node Nfo at the last stage of each delay unit DUf is coupled to the node N5.

A delay unit DUf includes: an inverter IV30 inverting a signal level of the input node Nfi to transmit the signal to the node Nf0; P type MOS transistors QP22 and QN22, and a resistance element Rf, constituting an inverter 137; P type MOS transistors QP24 and QN24 serving as delay capacitances; an inverter IV28; and a logic gate LG25 outputting the result of a NAND logic operation between the nodes Nf0 and Nf2.

The inverter 137, the transistors QP24 and QN24 acting as delay capacitances, the inverter IV28 and the logic gate LG25, included in the delay unit DUf correspond to the inverter 132, the transistors QP14 and QN14, the inverter IV18 and the logic gate LG20, respectively, included in the delay unit DUr shown in FIG. 8.

The delay unit DUf differs from the delay unit DUr shown in FIG. 8 in that when compared, in the delay unit DUf of FIG. 9, a signal level of the input node Nfi is inverted by the inverter IV30 to be transmitted to the inverter 137 and in that in the delay unit DUf of FIG. 9, an output of the logic gate 25 is transmitted direct to the output node Nfo.

Consequently, in the delay unit DUf, contrary to the case of delay unit DUr, transition from L level to H level on the input node Nfi is transmitted direct to the output node Nfo by the inverter 30 and the logic gate LG25. In contrast with this, transition from H level to L level on the input node Nfi is transmitted to the output node Nfo after elapse of a delay time added by the transistors QP24 and QN24 acting as the resistance element Rf and a delay capacitance.

Accordingly, a delay time ΔTd added by all of the falling edge delay circuit 135 can be set with values of a resistance element and a delay capacitance in the delay unit DUf and the number N of the delay units, independently of a delay time of a rising edge ΔTr for an rising edge.

In such a way, in the rising edge delay circuit 130 and the falling edge delay circuit 135, as shown in FIGS. 8 and 9, a delay stage can be configured so as to be affected, with difficulty, by fluctuations in temperature or internal power supply potential when adopting a configuration in which a delay time is imparted by a resistance element and a capacitance element. It is better that a signal propagation delay caused by the resistance element and the capacitance element is larger than a signal propagation delay caused by transistors forming the inverters and logic gates.

Referring again to FIG. 7, the rising edge of a control signal SDRV activated (L level to H level) and the falling edge of the control signal SDRV inactivated (H level to L level) by the flip flop 127 in response to each activations of a word line activation signal WLACT and a sense amplifier activation signal SEACT are transmitted to the node N5 delayed by the rising edge delay circuit 130 and the falling edge delay circuit 135 by the respective delay times ΔTr and ΔTf.

A signal level on the node N5 is amplified by the inverters IV12 and IV14 to output the signal as a forced current supply control signal DRV. On the other hand, the inverter IV16 outputs a forced current supply control signal ZDRV, which is an inverted signal of the signal DRV. As a result, the forced current supply control signals DRV and ZDRV are activated to H level and L level, respectively, at a time point till which a prescribed time adjustable by a delay time ΔTf elapses from activation of a word line performed in advance of activation of a sense amplifier and inactivated to L level and H level, respectively, at a time point till which a prescribed time adjustable by a delay time ΔTf elapses from activation of a sense amplifier.

A data amplifying operation performed by the sense amplifier serving as a load is, as described in FIG. 3, performed during a series of memory access operations; therefore, the data amplifying operation gets started when a sense amplifier activation signal SEACT, which is a trigger to actual current consumption, is activated after an activation of a word line corresponding to a preliminary operation is first performed. Consequently, forced current supply control signals DRV and ZDRV are activated and inactivated in the above described timing; thereby, a current is forcibly supplied to the internal power supply line providing an internal power supply potential int.Vdd before current consumption of a sense amplifier, which is a load, gets started, which can make a rapidly increased, large current consumption by the sense amplifier coped with without great dependency on a value of a stabilization capacitance 92. Furthermore, forced current supply to the internal power supply line is ceased before current consumption by the sense amplifier is terminated; thereby, enabling prevention of the internal power supply line from being overcharged.

The internal power supply control circuit 115 further includes: an N type MOS transistor QN10 coupled between the node N3 and the ground line 85. A word line activation signal WLACT inverted by the inverter IV10 is inputted to the gate of the transistor QN10. With the inputting of the inverted word line activation signal WLACT, a signal level of a control signal SDRV is reset to L level at least when a word line activation signal WLACT is inactive; therefore, in this period, no forced current supply by the current supply transistor QD1 is performed in the internal power supply circuit 100.

Further, a word line activation signal WLACT has only to be used as an control signal ACT for supplying an operating current to the potential difference amplifying circuit 105 in the internal power supply circuit 110.

It should be appreciated that a case is also considered where memory cells MC are divided into a plurality of blocks in a memory cell array 30, and activation of a word line and activation of a sense amplifier are controlled in each of the plurality of blocks, which are independent of each other; that is where a word line activation signal and a sense amplifier activation signal are provided to each block.

Figure 10:
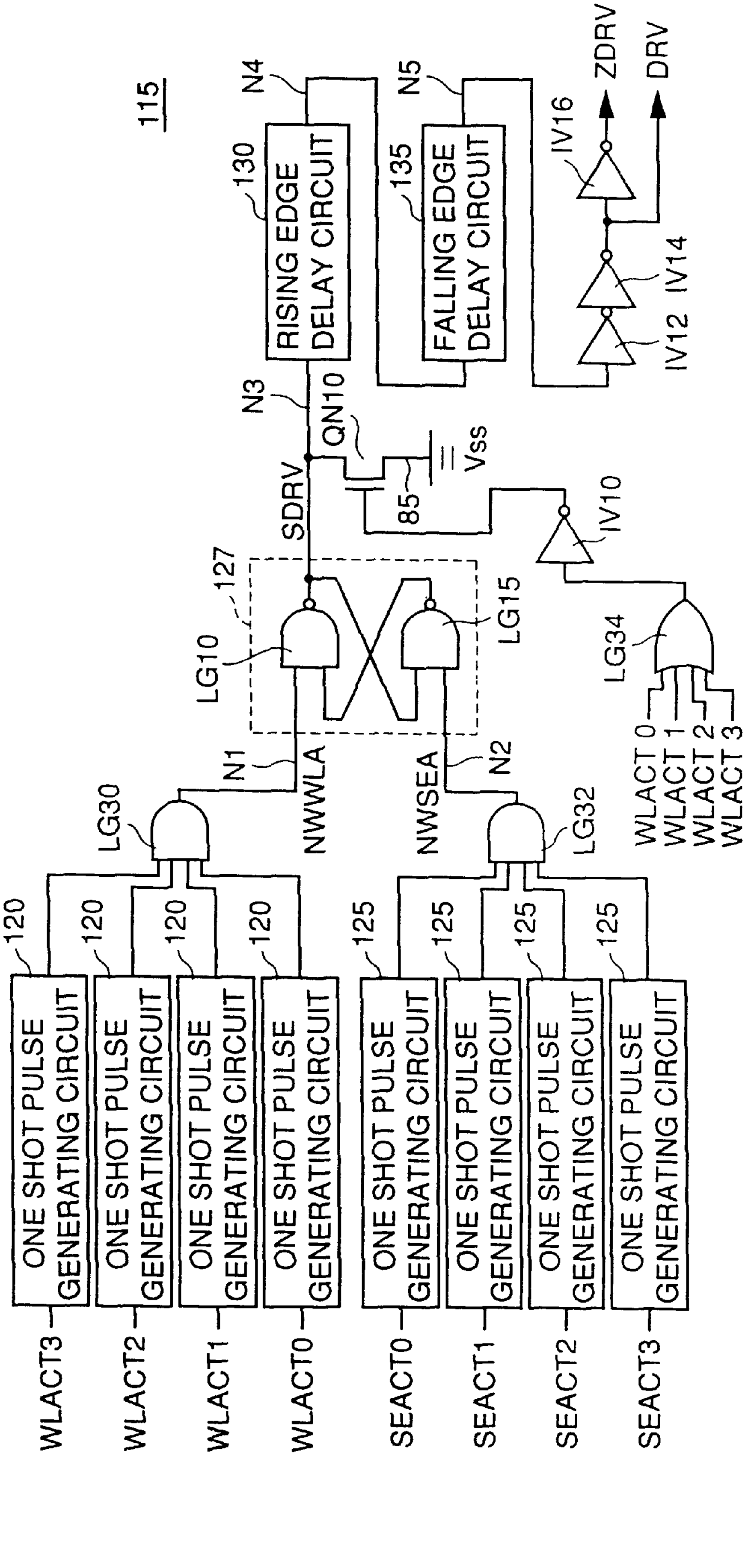
FIG. 10 is a block diagram representing a configuration of an internal power supply control circuit 115 corresponding to a case where a memory cell array 30 is divided into a plurality of blocks.

FIG. 10 is a block diagram representing a configuration of an internal power supply control circuit 115 corresponding to a case where a memory cell array 30 is divided into a plurality of blocks.

In FIG. 10, shown is a configuration of the internal power supply control circuit 115 in a case where a memory cell array 30 is divided into four blocks as one example. Word line activation signals WLACT0 to WLACT3 and sense amplifier activation signals SEACT0 to SEACT3 are provided corresponding to the respective four blocks.

One shot pulse generating circuits 120 are provided corresponding to the respective word line activation signals WLACT0 to WLACT3. Similar to this, one shot pulse generating circuits 125 are provided corresponding to the respective sense amplifier activation signals SEACT0 to SEACT3. A logic gate LG30 outputs the result of an OR operation on one shot pulses outputted by the respective one shot pulse generating circuits 120 (wherein the OR operation is one in a negative logic system and corresponds to an AND operation in a positive logic system). With such a configuration, when a word line activation signal is activated in one block, a one shot pulse signal NWWLA is activated.

Likewise, the logic gate LG32 outputs the result of an OR operation on one shot pulses outputted by the one shot pulse generating circuits 125 (wherein the OR operation is one in a negative logic system and corresponds to an AND operation in a positive logic system). With such a configuration, when a sense amplifier activation signal is activated in one block, a one shot pulse signal NWSEA is activated.

No detailed description will be repeated of activation and inactivation of forced current supply control signals DRV and ZDRV in response to one shot pulse signals NWWLA and NWSEA since the activation and inactivation are as described above. In such a way, even when the memory cell array 30 is divided into a plurality of blocks, forced current supply control signals DRV and ZDRV can be generated to deal with a current in a load.

Furthermore, on/off of the transistor QN10 has only to be controlled based on an output of the logic gate LD34 performing an OR operation on word line activation signals WLACT0 to WLACT3 provided corresponding to the respective plurality of blocks. A control signal ACT, as well, has only to be generated based on the result of an OR operation on word line activation signals provided corresponding to the respective plurality of blocks, that is based on an output of the logic gate LG34.

Description will be given of operation of the internal power supply control circuit 115 with reference to FIG. 11.

Figure 11:
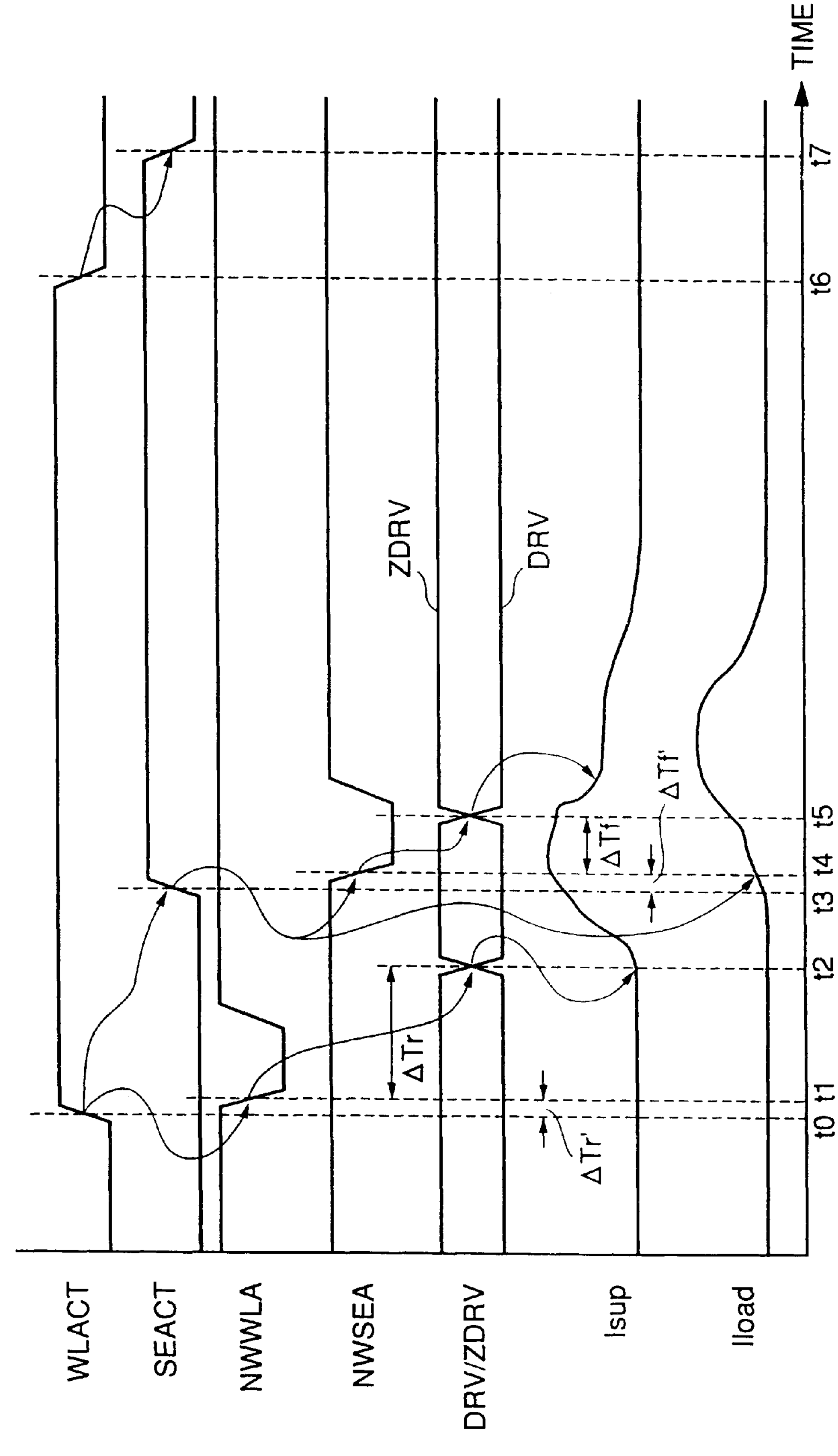
FIG. 11 is a timing chart for describing operations of the internal power supply control circuit.

Referring to FIG. 11, a word line activation signal VVLACT is activated (L level to H level) at a time point t0. In response to the activation, a one shot pulse generating circuit 120 activates a one shot pulse signal NWWLA to L level at a time point t1 till which a time delay ΔTr' elapses from a time point t0 and keeps the one shot pulse signal NWWLA in an active state at L level for a prescribed period.

An output signal SDRV of the flip flop 127 rises to H level from L level in response to activation of a one shot pulse signal NWWLA (not shown). The rising edge of the output signal SDRV is delayed by the rising edge delay circuit 130 by ΔTr. In response to the rise to H level, forced current supply control signals DRV and ZDRV are activated at a time point t2 till which a delay time ΔTr elapses from the time point t1. The time point t2 corresponds to the time point ta shown in FIG. 5. In response to the activation, in the internal power supply circuit 100, a gate potential of the current supply transistor QD1 begins to decrease and a supply current Isup is forced to begin flowing.

On the other hand, when a sense amplifier activation signal SEACT is activated at a time point t3 corresponding to the time point tb shown in FIG. 5, current consumption in the sense amplifier SA gets started, in response to the activation, to begin flowing of a load current Iload.

On the other hand, in response to activation (L level to H level) of a sense amplifier activation signal SEACT at a time point t3, the one shot pulse generating circuit 125 activates a one shot pulse signal NWSEA to L level at a time point t4 till which a delay time ΔTf' elapses from the time point t3 and keeps the one shot pulse signal NWSEA in an active state at L level for a prescribed period.

In response to the activation, an output signal SDRV of the flip flop 127 falls to L level from H level (not shown). The falling edge of the output signal SDRV is delayed by the falling edge delay circuit 135 by ΔTf. In response to the fall, forced current supply control signals DRV and ZDRV are inactivated at time point t5 till which a delay time ΔTf elapses from the time point t4. The time point t5 corresponds to the time point tc shown in FIG. 5.

In response to the activation, ceased is forced current supply by the current supply transistor QD1 in the internal power supply circuit 100. Supply of a load current Iload is performed by an electric charge excessively supplied in advance onto the internal power supply line 90 during a period from the time point t2 till the time point t5.

Thereafter, at a time point t6, a word line activation signal WLACT is inactivated and at a time point t7 (corresponding to the time point td shown in FIG. 5), a sense amplifier activation signal SEACT is inactivated, thereby ceasing consumption of a load current. As described above, when a load is a sense amplifier SA, a flow of a consumed current is concentrated during a part of an activation period of a sense amplifier activation signal SEACT.

At and after the time point t5, in the internal power supply circuit 100, current supply is performed to the internal power supply line 90 based on the comparison result between an internal power supply potential int.Vdd and the reference potential Vref In such a way, forced current supply by the internal power supply circuit 100 gets started at a timing that is sure to be earlier than current consumption in a load (a sense amplifier SA) and forced current supply is ceased in advance of termination of current consumption in the load and thereby, not only a transitional sag in internal power supply potential int.Vdd in a start period of current consumption in a load but also a rise in internal power supply potential int.Vdd caused by overcharge of the internal power supply line 90 in a steady state can be compatibly prevented from occurring with reliability, without great dependency on a value of the stabilization capacitance 92.

Next, description will be given of a variation of configuration of the internal power supply control circuit 115.

Figure 12:
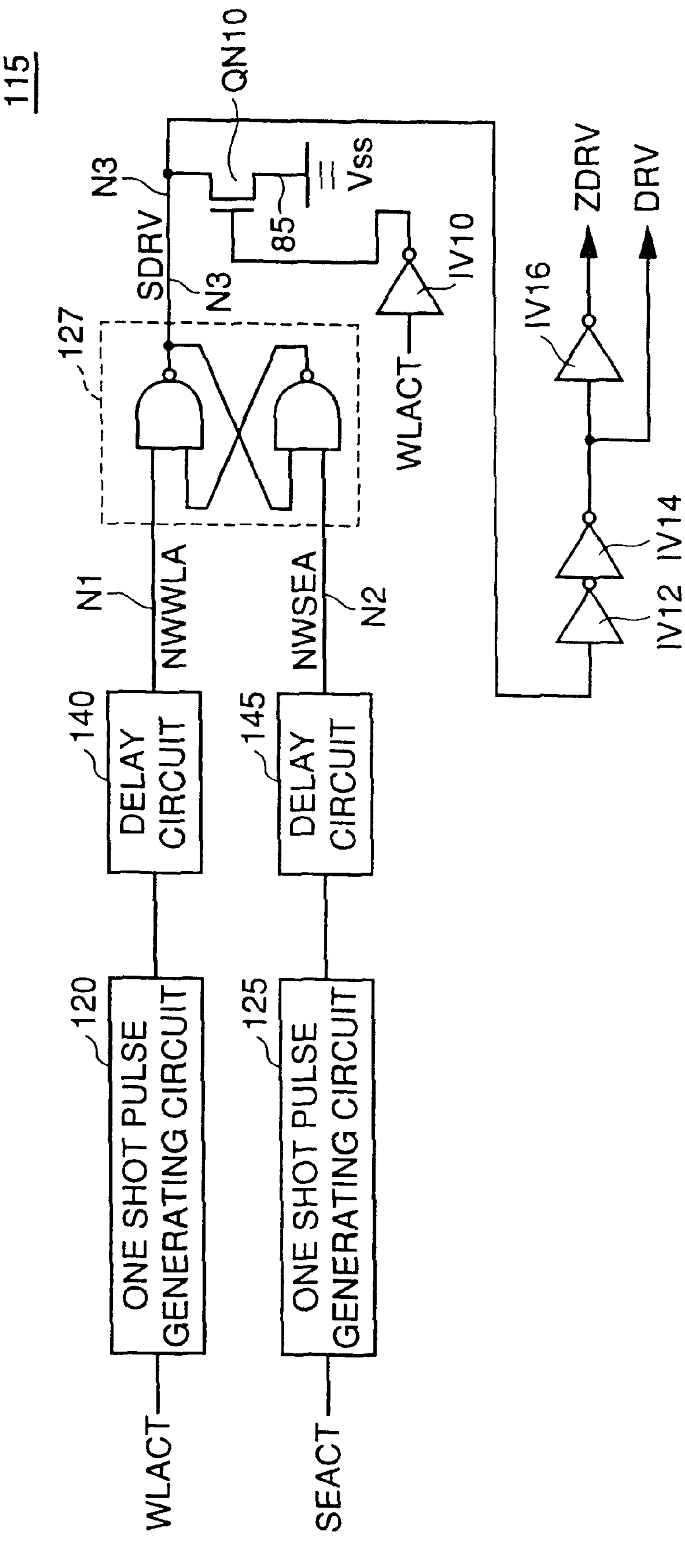
FIG. 12 is a block diagram representing another example configuration of the internal power supply control circuit.

The internal power supply control circuit 115 is different from the internal power supply control circuit shown in FIG. 7 in that when compared, in FIG. 12, delay circuits 140 and 145 provided between a one shot pulse generating circuit 120 and a node N1, and between a one shot pulse generating circuit 125 and a node N2, respectively, instead of the respective rising edge delay circuits 130 and 135. The other parts of the configuration are similar to corresponding parts of the configuration of FIG. 7; therefore, no detailed description is repeated of the other parts.

The delay circuit 140 delays a one shot pulse signal NWWLA activated by a one shot pulse generating circuit 120 to L level in response to activation of a word line activation signal WLACT by ΔTr to transmit the activated one shot pulse signal NWWLA to a node N1. Likewise, the delay circuit 145 delays a one shot pulse signal NWSEA activated to L level in response to activation of a sense amplifier activation signal SEACT by ΔTf to transmit the activated one shot pulse signal NWSEA to a node N2.

Figure 13:
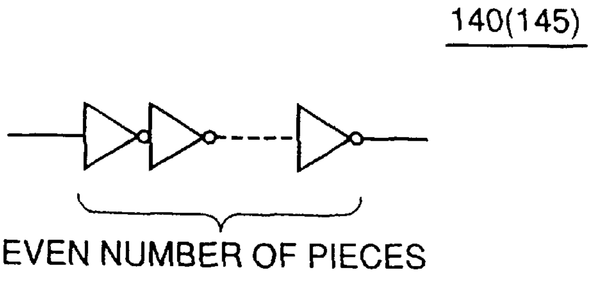
FIG. 13 is an illustration representing a first example configuration of delay circuits 140 and 145.

Referring to FIG. 13 according to a first example configuration, the delay circuits 140 and 145 can be constructed of an even number of inverters connected in series to each other.

Figure 14:
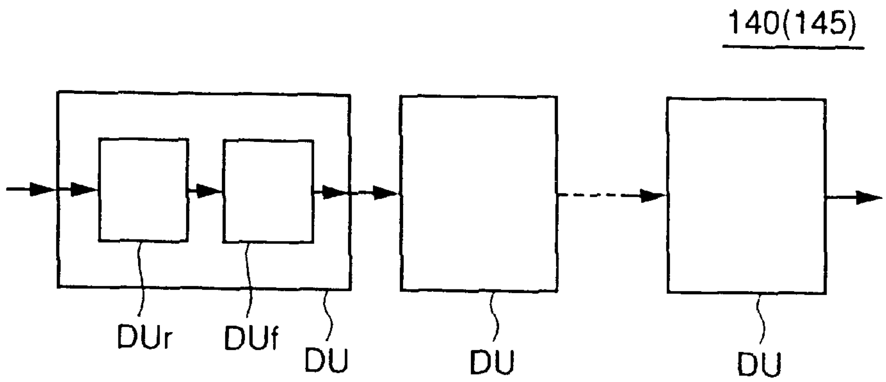
FIG. 14 is an illustration representing a second example Configuration of the delay circuits 140 and 145.

Referring to FIG. 14, the delay circuits 140 and 145 according to a second example configuration can be constructed of a plurality of delay stages DU arranged in series, each delay stage DU being constructed of a serial combination of a delay unit DUr and a delay unit DUf described in FIGS. 8 and 9.

Figure 15:
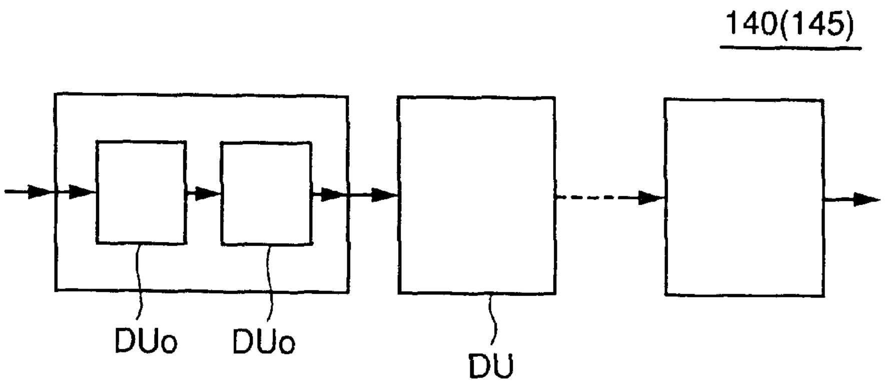
FIG. 15 is an illustration representing a third example configuration of the delay circuits 140 and 145.

Referring to FIG. 15, the delay circuits 140 and 145 according to a third example configuration can also be configured such that in the second 5 configuration of FIG. 14, delay units DUo analogous to the delay units DUr and DUf in configuration are substituted therefor.

Figure 16:
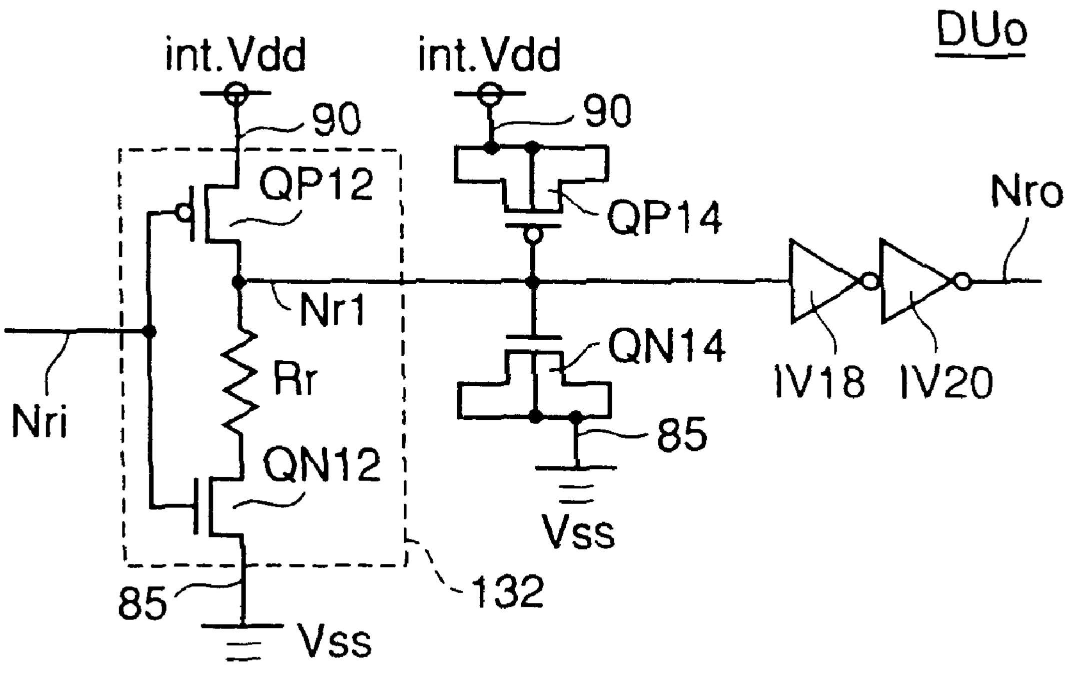
FIG. 16 is a circuit diagram representing a configuration of a delay circuit unit DUo.

Referring to FIG. 16, the delay unit DUo is different from the delay unit DUr shown in FIG. 8 in that when compared, the configuration of FIG. 16 includes no logic gate LG18 receiving an input signal to the input node Nri as one of the inputs thereto. The other parts of the configuration of the delay unit DUo are similar to corresponding parts of the configuration of the delay unit DUr. With such a configuration adopted, the delay stage DU constructed of a combination of two delay units DUo can delay the rising edge and falling edge of an input signal in a uniform manner.

As described above, by use of the delay units DUf and DUr instead of a simple inverter stage, a stable delay time can be set without being affected by fluctuations in temperature or internal power supply potential.

With such a configuration adopted, too, an operation can be performed in which delay times ΔTr and ΔTf are independently imparted in the respective delay units 140 and 145 and an activation period of the forced current supply signals DRV and ZDRV is controlled in timing similar to one shown in FIG. 11.

Figure 17:
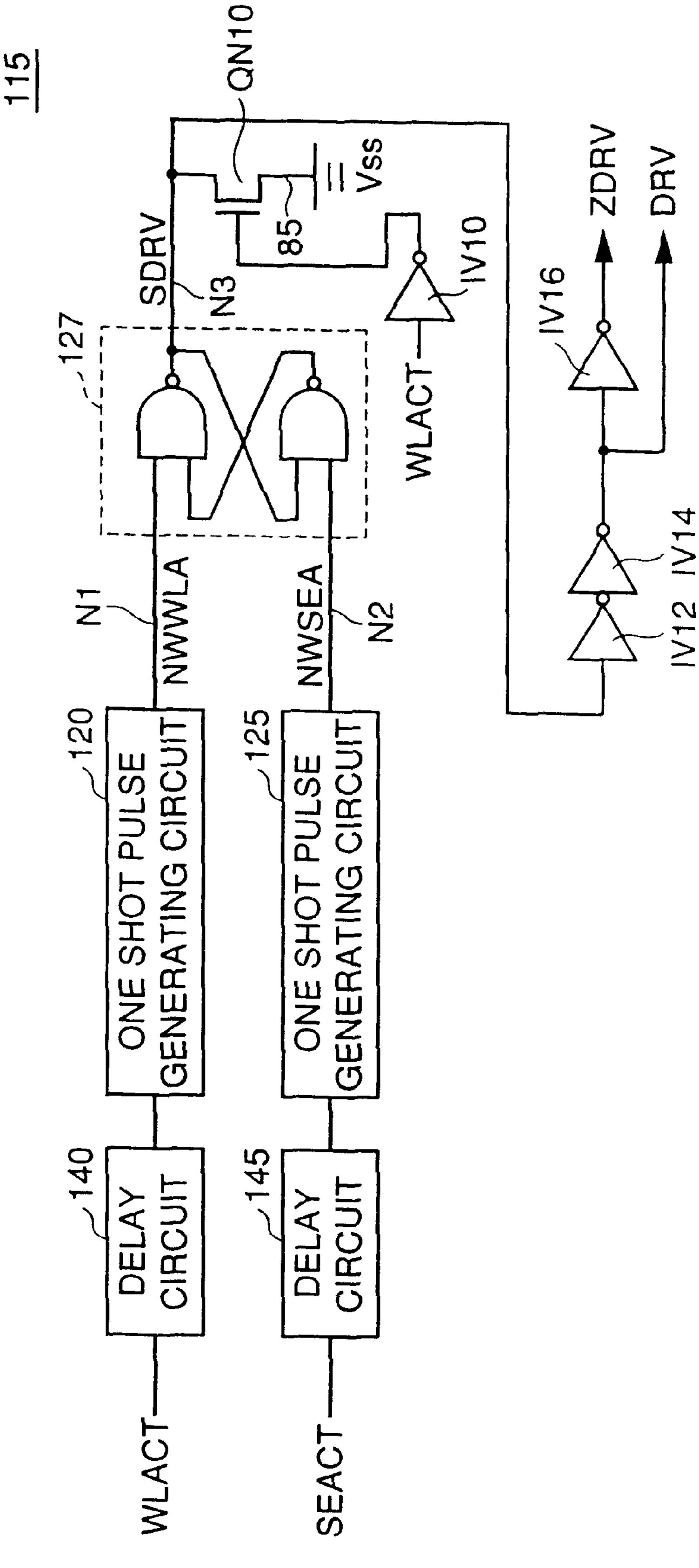
FIG. 17 is a block diagram representing still another example configuration of the internal power supply control circuit.

FIG. 17 represents still another example configuration of the internal power supply control circuit 115.

The internal power supply control circuit shown in FIG. 17 is different from the internal power supply control circuit shown in FIG. 12 in that when compared, in the configuration of FIG. 17, the delay circuits 140 and 145 are provided at stages before the respective one shot pulse generating circuits 120 and 125. The other parts of the configuration and operations thereof are similar to corresponding parts of the configuration and operations of the case of FIG. 11; therefore, no detailed descriptions thereof are repeated.

With such a configuration adopted, the delay circuits 140 and 145 delay a word line activation signal WLACT and a sense amplifier activation signal SEACT by respective delay times ΔTr and ΔTf set independently and transmit the signals to the respective one shot pulse generating circuits 120 and 125.

With such a configuration adopted, too, an activation period of the forced current supply control signals DRV and ZDRV can be controlled in the timing shown in FIG. 10 similar to the cases of the internal power supply control circuits shown in FIGS. 7 and 12.

It should be appreciated that in a case where in the memory cell array 30, memory cells MC are divided into a plurality of blocks and arranged in a pattern, and activation of a word line and activation of a sense amplifier are controlled in each of the plurality of blocks as a unit, which is independent of another, that is a word line activation signal and a sense amplifier activation signal are provided to each block; the result of an OR operation has to be obtained on each of the one shot pulse generating circuits 120 and 125 in the circuit configurations of FIGS. 12 and 17 as described in FIG. 10.

Figure 18:
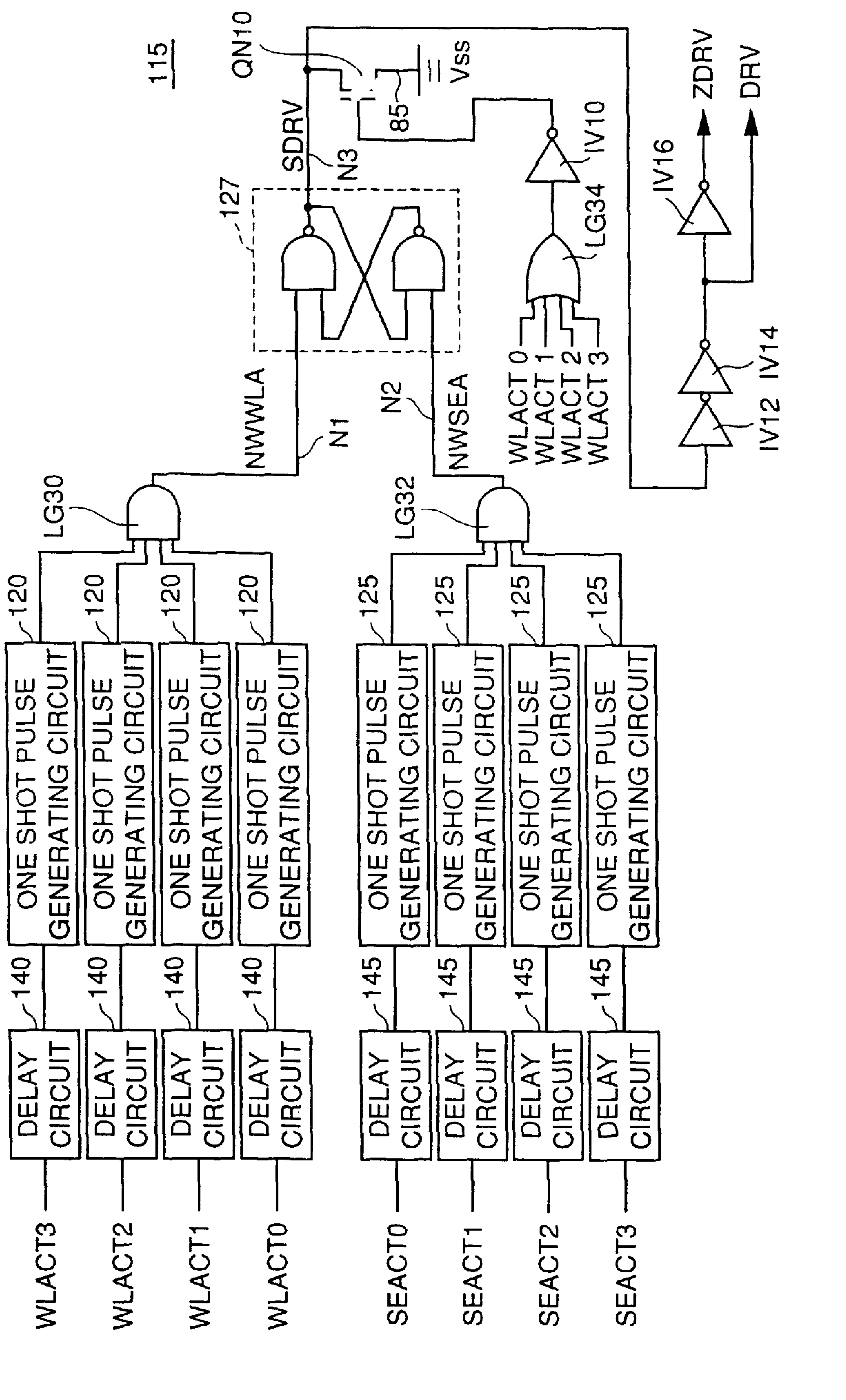
FIG. 18 is a block diagram representing a configuration in a case where the internal power supply control circuit 115 shown in FIG. 17 is applied to the memory cell array 30 divided into a plurality of blocks.

Referring to FIG. 18, especially in a case where the internal power supply control circuit 115 having the configuration of FIG. 17 is applied to the memory cell array 30 divided into a plurality of blocks, a plurality of pairs of delay circuits 140 and 145 have to be provided corresponding to the respective divided blocks. Hence, in such a case, the configuration of the internal power supply control circuit 115 of any of FIGS. 7 and 12 is preferably adopted.

Second Embodiment

Description will be given of a variation of configuration of an internal power supply circuit, that is VDC, in the second embodiment.

Configurations of the internal power supply circuit described in the second embodiment have an activation period of the forced current supply control signals DRV and ZDRV similar to that described in the first embodiment; therefore no description thereof is repeated.

Figure 19:
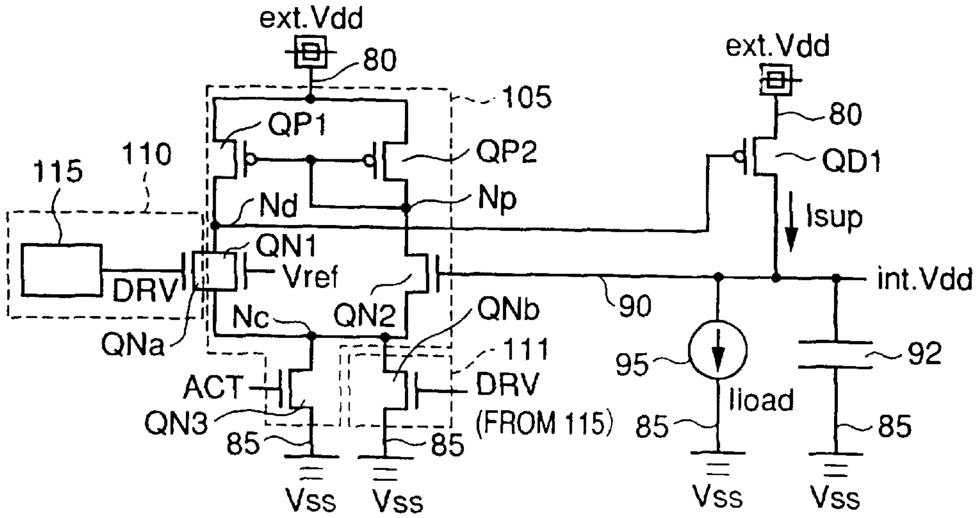
FIG. 19 is a circuit diagram representing a configuration of an internal power supply circuit according to a second embodiment.

Referring to FIG. 19, an internal power supply circuit according to the second embodiment is different from the internal power supply circuit 100 (shown in FIG. 4) in configuration in that when compared, in FIG. 19, a forced current supply control circuit 110 has an N type MOS transistor QNa connected in parallel to the transistor QN1 in a potential difference amplifying circuit 105 instead of the transistor QPa. A forced current supply control signal DRV set at H level when being active is inputted to the gate of the transistor QNa.

The transistor QNa is turned on at a timing similar to the transistor QPa shown in FIG. 4 forcibly reduces a potential level of a node Nd regardless of a potential level of an internal power supply potential int.Vdd. A gate potential of a current supply transistor QD1 decreases according to the reduction of a potential level of the node Nd; therefore, forced current supply is performed to an internal power supply line 90 from an external power supply line 80 during an activation period of a forced current supply control signal DRV.

If necessary, a forced current supply control circuit 111 can be further provided in the configuration as well. The forced current supply control circuit 111 includes: an N type MOS transistor QNb coupled electrically between a node Nc and a ground line 85. A forced current supply control signal DRV is inputted to the gate of the transistor QNb. When the forced current supply control signal DRV is activated to H level, an operating current of a current mirror amplifier constituting a potential difference amplifying circuit 105 increases; therefore, a speed at which fluctuations in internal power supply potential int.Vdd is reflected on a potential level of a node Nd is increased, thereby enabling improvement of controllability on the internal power supply potential int.Vdd.

Furthermore, since a potential level of the node Nc in an activation period of a forced current supply control signal DRV becomes closer to the ground potential Vss by the forced current supply control circuit 111, a forced supply current Isup of a current supply transistor QD1 can be increased in this period.

The other parts of the configuration are similar to corresponding parts of the configuration of the internal power supply circuit 100; therefore, no detailed description thereof is repeated.

Figure 20:
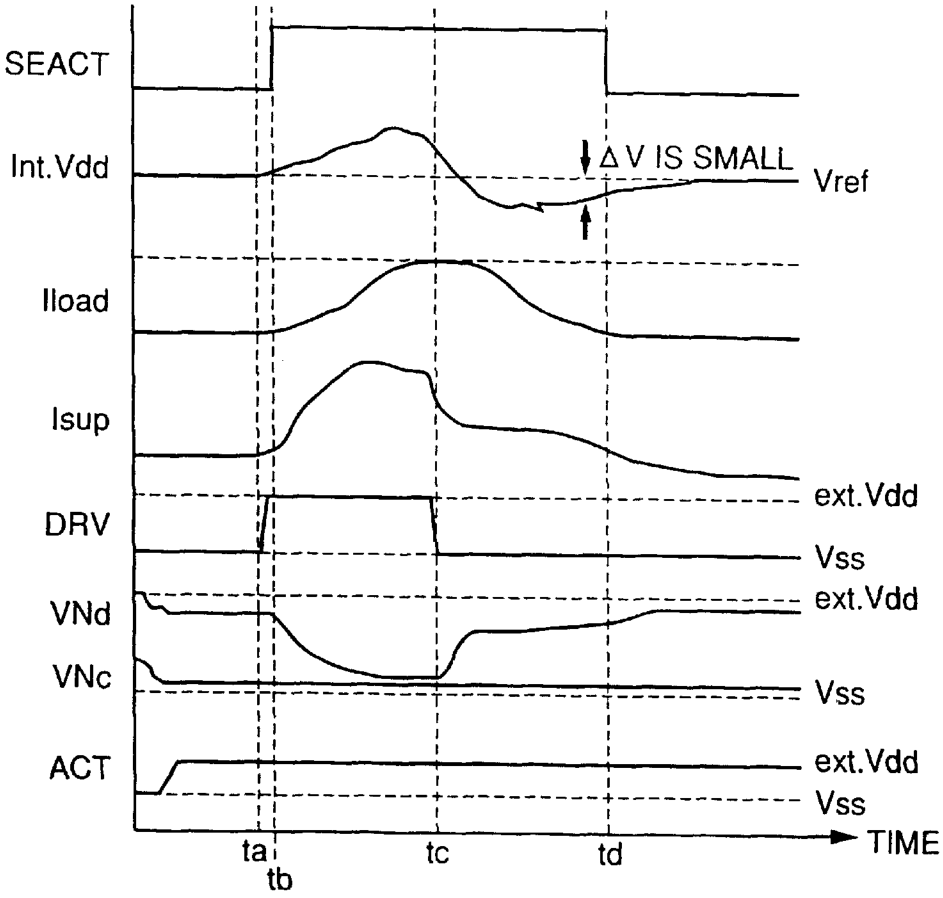
FIG. 20 is a timing chart describing operations of the internal power supply circuit according to a second embodiment.

FIG. 20 is a timing chart describing operations of the internal power supply circuit according to the second embodiment.

Referring to FIG. 20, at a time point ta, a forced current supply control signal DRV is activated to H level and in response to the activation, a potential level of the node Nd, that is a gate potential of the current supply transistor QD1, begins to decease. With the decrease in the gate potential, the current supply transistor QD1 forcibly supplies a current Isup and thereby, the internal power supply line 90 receives current supply in advance of the start of current consumption by a load 95; therefore, an internal power supply potential int.Vdd is not reduced to a great extent even when, at a time point tb, consumption of a load current Iload gets started in a sense amplifier as a load in response to activation of a sense amplifier activation signal SEACT.

Moreover, at a time point tc, a forced adjustment of a gate potential of the current supply transistor QD1 is ceased by inactivation to L level of a forced current supply control signal DRV similar to the case of FIG. 11; therefore, after the inactivation of the signal, a normal control of the internal power supply potential is performed according to comparison between an internal power supply potential int.Vdd and the reference potential Vref, thereby, enabling prevention of overcharge on the internal power supply line 90.

With such a configuration of the internal power supply circuit, too, the internal power supply potential int.Vdd can be stably held without great dependency on a value of a stabilization capacitance by establishment of matching with the timing of current consumption in a load similar to the case of the internal power supply circuit 100 shown in the first embodiment.

First Modification of Second Embodiment

Figure 21:
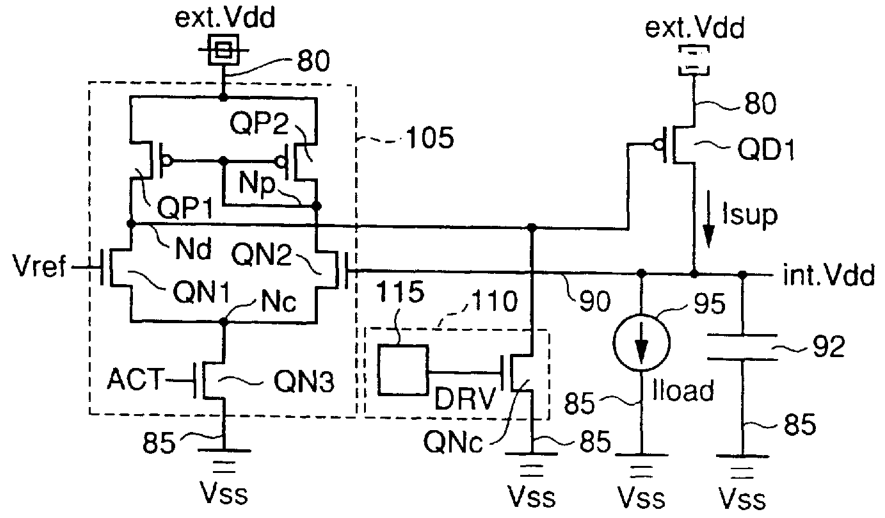
FIG. 21 is a circuit diagram representing a configuration of an internal power supply circuit according to a first modification of the second embodiment.

Referring to FIG. 21, An internal power supply circuit according to the first modification of the second embodiment is different from the internal power supply circuit 100 (shown in FIG. 4) in configuration in that when compared, in FIG. 21, a forced current supply control circuit 110 has an N type MOS transistor QNc electrically coupled between a node Nd and a ground line 85 instead of the transistor QPa.

A forced current supply control signal DRV is inputted to the gate of the transistor QNc. The gate of a current supply transistor QD1 is connected to a ground line 85 in response to activation (H level) of a forced current supply control signal DRV. In response to the connection, the current supply transistor QD1 supplies a current to an internal power supply line 90 regardless of an internal power supply potential int.Vdd. The other parts of the configuration are similar to corresponding parts of the configuration of the internal power supply circuit 100; therefore, no detailed description thereof is repeated.

Figure 22:
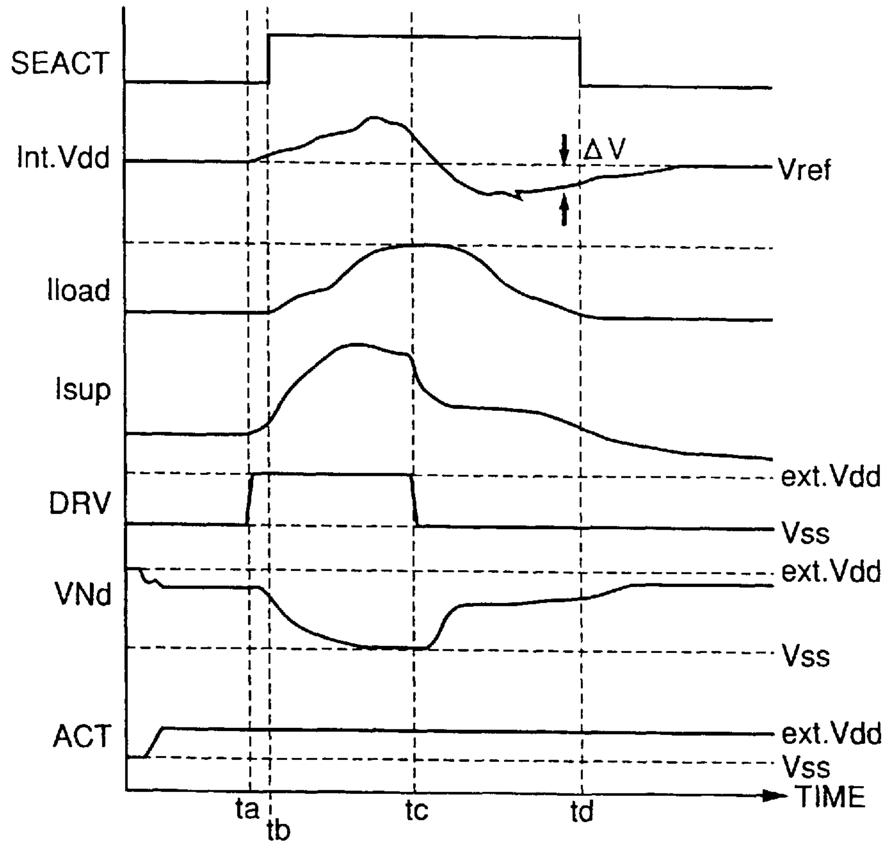
FIG. 22 is a timing chart describing operations of the internal power supply circuit according to the first modification of the second embodiment.

Referring to FIG. 22, when at a time point ta, a control signal DRV is activated, a potential level of a node Nd falls down to the ground potential Vss. During the period of falling down of the potential level, the current supply transistor QD1 forcibly supplies a current Isup to an internal power supply line 90 from an external power supply line 80 regardless of a potential level of the internal power supply potential int.Vdd.

By doing so, the internal power supply line 90 receives current supply in advance of the start of current consumption by a load 95; therefore, an internal power supply potential int.Vdd is not reduced to a great extent even when at a time point tb, consumption of a load current Iload gets started in a sense amplifier as a load in response to activation of a sense amplifier activation signal SEACT.

Moreover, at a time point tc, a forced adjustment of a gate potential of the current supply transistor QD1 is ceased by inactivation to L level of a forced current supply control signal DRV similar to the case of FIG. 11; therefore, at and after the inactivation of the signal, a normal control of the internal power supply potential is performed according to comparison between an internal power supply potential int.Vdd and the reference potential Vref, thereby, enabling prevention of overcharge on the internal power supply line 90.

With such a configuration of the internal power supply circuit, too, the internal power supply potential int.Vdd can be stably held without great dependency on a value of a stabilization capacitance by establishment of matching with the timing of current consumption in a load similar to the case of the internal power supply circuit 100 shown in the first embodiment.

Furthermore, according to the configuration of the internal power supply circuit according to the first modification of the second embodiment, a gate potential of the current supply transistor QD1 can be reduced down to the ground potential Vss in a period of performing the forced current supply; therefore, a supply current Isup by the current supply transistor QD1 can be set to a large value so as to quickly perform forced current supply. With such configuration and operation, even a case where current consumption by the load 95 arises with more of rapidness can be coped with.

Second Modification of Second Embodiment

Figure 23:
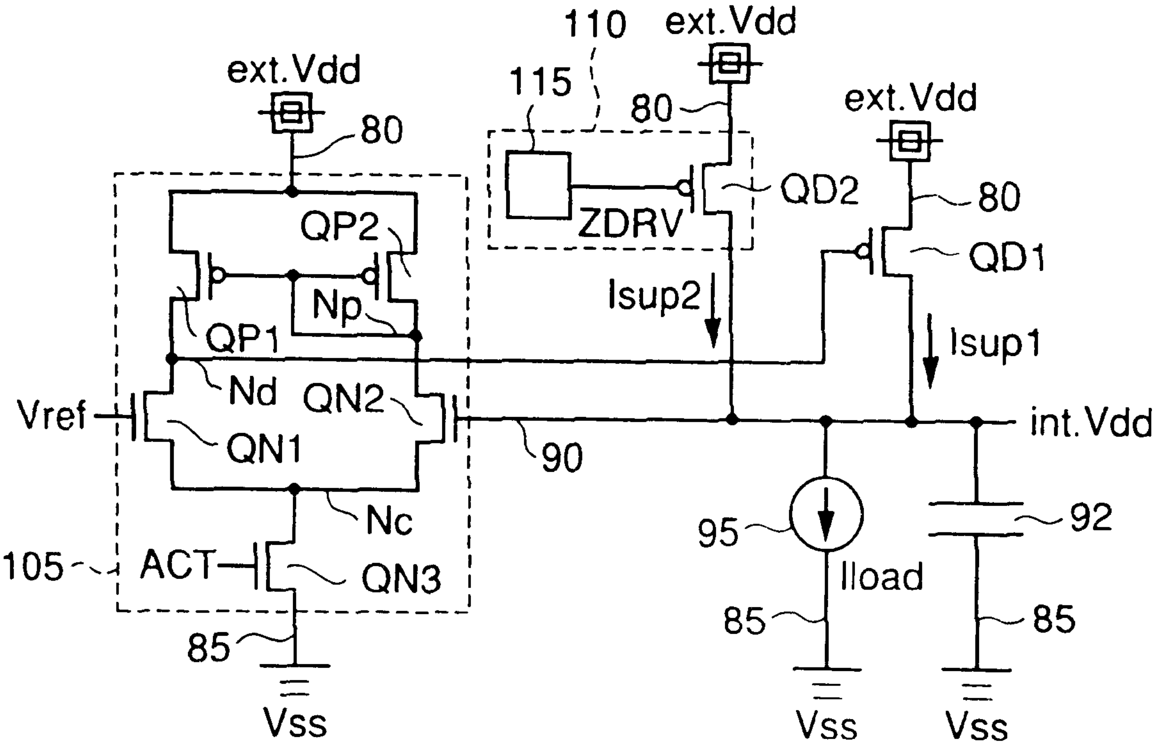
FIG. 23 is a circuit representing a configuration of an internal power supply circuit according to a second modification of the second embodiment.

Referring FIG. 23, an internal power supply circuit according to the second modification of the second embodiment of the present invention is different from the internal circuit 100 (shown in FIG. 4) in configuration in that when compared, in FIG. 23, a forced current supply control circuit 110 has a P type MOS transistor QD2 connected in parallel to a current supply transistor QD1 between an external power supply line 80 and an internal power supply line 90. A forced current supply control signal ZDRV is inputted to the gate of the transistor QD2.

The other parts of the configuration of FIG. 23 are similar to corresponding parts of the configuration of the internal power supply circuit 100; therefore, no detailed description thereof is repeated.

Figure 24:
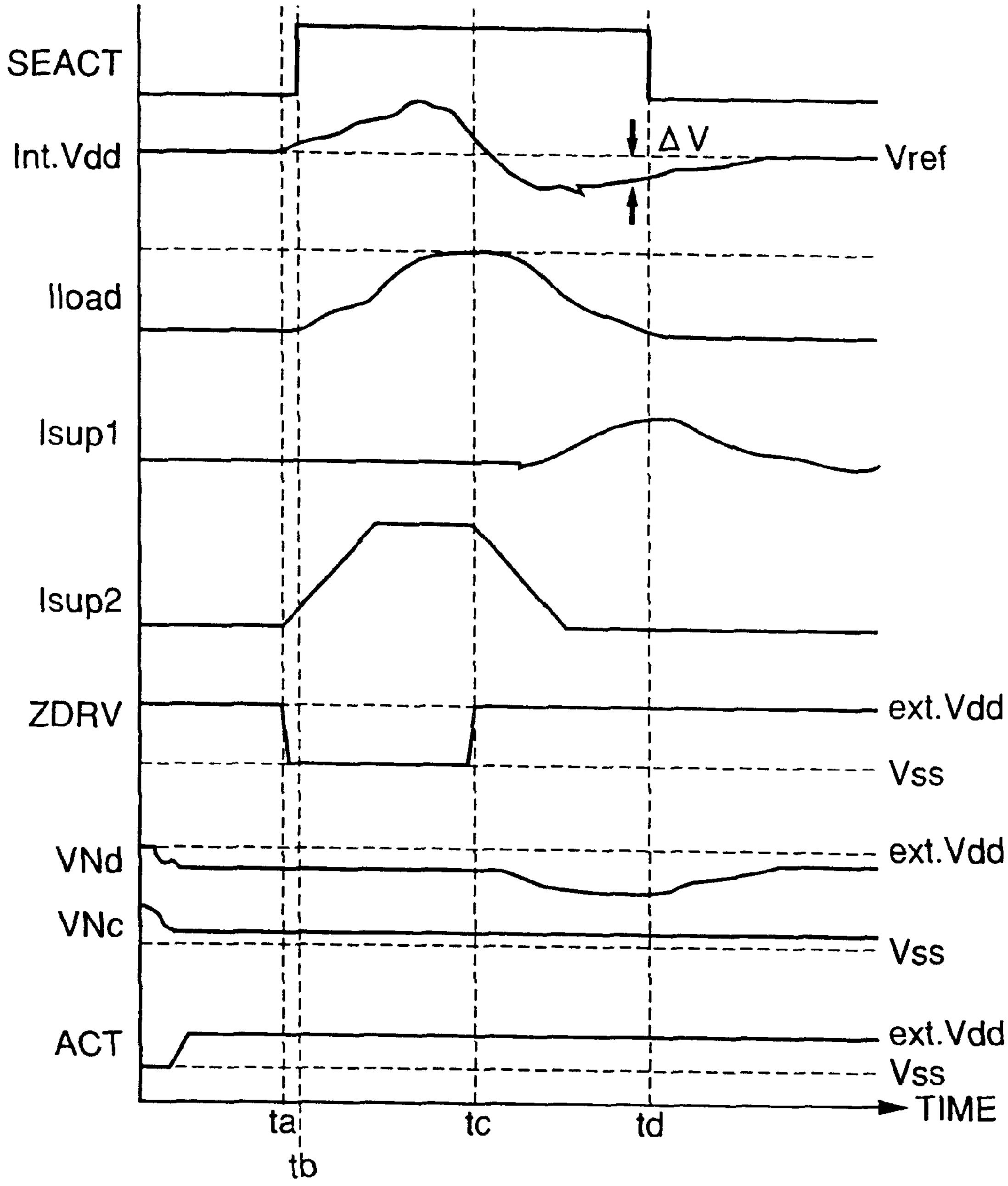
FIG. 24 is a timing chart describing operations of the internal power supply circuit according to the second modification of the second embodiment.

Referring to FIG. 24, in an internal power supply circuit according to the second example modification of the second embodiment, too, a forced current supply control signal ZDRV is activated to L level in a period from a time point ta till a time point tc. A transistor QD2 constituting a forced current supply control circuit 110 supplies a current Isup2 to an internal power supply line 90 from an external power supply line 80 in response to activation of the forced current supply control signal ZDRV.

In contrast to this, a current supply transistor QD1 supplies a current Isup1 to the internal power supply line 90 from the external power supply line 80 according to a potential level VNd outputted onto a node Nd by a potential difference amplifying circuit 105 according to a potential level difference between a potential level int.Vdd of the internal power supply line 90 and the reference potential Vref.

With such a configuration adopted, too, when an activation period of the control signal ZDRV is properly adjusted corresponding to a period of current consumption of the load 95, then an effect similar to that of the internal power circuit described above can be enjoyed.

In the configurations shown in the first and second embodiments, by externally providing an additional forced current supply control circuit 110 to a configuration of a general VDC, a prescribed new effect described above can be obtained. Accordingly, there is no need to modify fundamental constituents of the configuration of the VDC, thus enabling realization of easy circuit design.

It should be appreciated that while in the first and second embodiments, the potential difference amplifying circuit 105 is constituted of a current mirror amplifier with a P type MOS transistor as a load, a current mirror amplifier with an N type MOS transistor as a load can be applied instead.

Third Embodiment

In the third embodiment, description will be given of a configuration capable of selecting whether or not a forced current supply function is exerted according to an operating condition of a semiconductor memory device in a case where an internal power supply circuit supplying a forced current to an internal power supply line, which is described in the first and second embodiments, is applied to the semiconductor memory device.

Figures 25A, 25B, 25C:
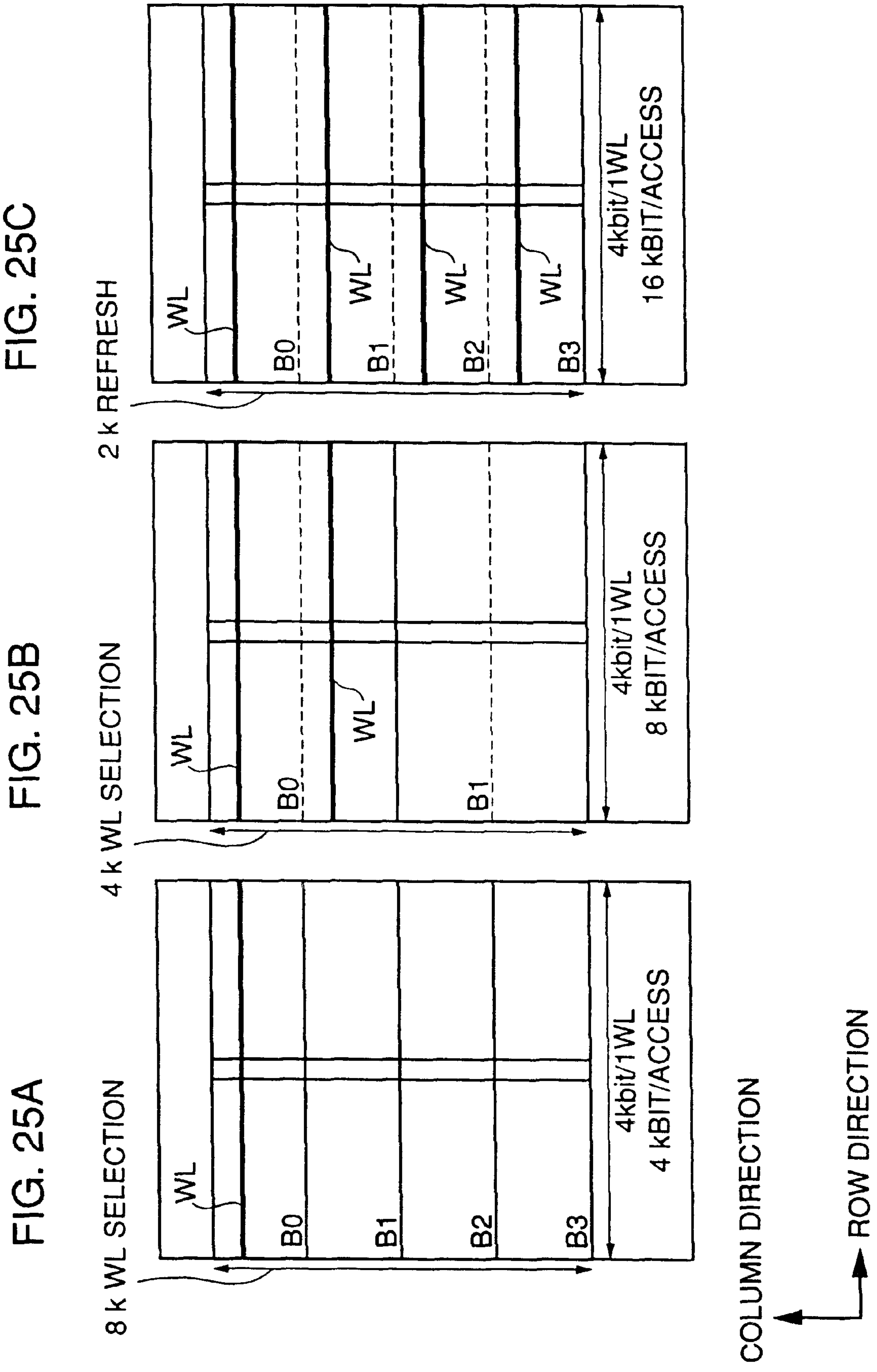
FIGS. 25A to 25C are conceptual illustrations for describing differences in amount of consumed current corresponding to operating conditions of a semiconductor memory device.

FIGS. 25A to 25C are conceptual illustrations for describing differences in amount of consumed current corresponding to operating conditions of a semiconductor memory device.

In FIGS. 25A to 25C, shown is a configuration of, for example, a 32 Mbit DRAM core. In FIG. 25A, the DRAM core is divided into four banks B0 to B3, one word line in one bank is selectively activated in each time row access and selection of 8 k word lines is performed. 4 kbit of memory cells are connected to each word line. Consequently, in a case of FIG. 25A, datas amounting to 1×4 kbits are read out onto a sense amplifier circuit in a one row access operation in a normal operation. Hereinafter, the number of bits included in the datas read out onto the sense amplifier circuit in one time row access in such a way is referred to a page size as well.

In FIG. 25B, a 32 Mbit DRAM core is divided into two banks B0 and B1. Two word lines WL are selected in one of the banks in each row access operation in the normal operation. Consequently, in this case, selection of 4 kbit word lines WL is performed and thereby, a page size amounts to 8 kbits.

In FIG. 25C, shown is word line selection in a refresh mode. Especially as miniaturization in a fabrication process progresses to reduce a data holding capacitance of a memory cell, there arises a necessity to shorten a refresh cycle, which provides a background that the number of word lines selected in a one time refresh operation is forcibly increased compared with one in the normal operation.

That is, in FIG. 25C, 4 word lines are selected in one time row access in the refresh operation. By doing so, datas amounting to 16 kbits have to be amplified by a sense amplifier circuit in a one time row access in the refresh operation.

Figure 26A:
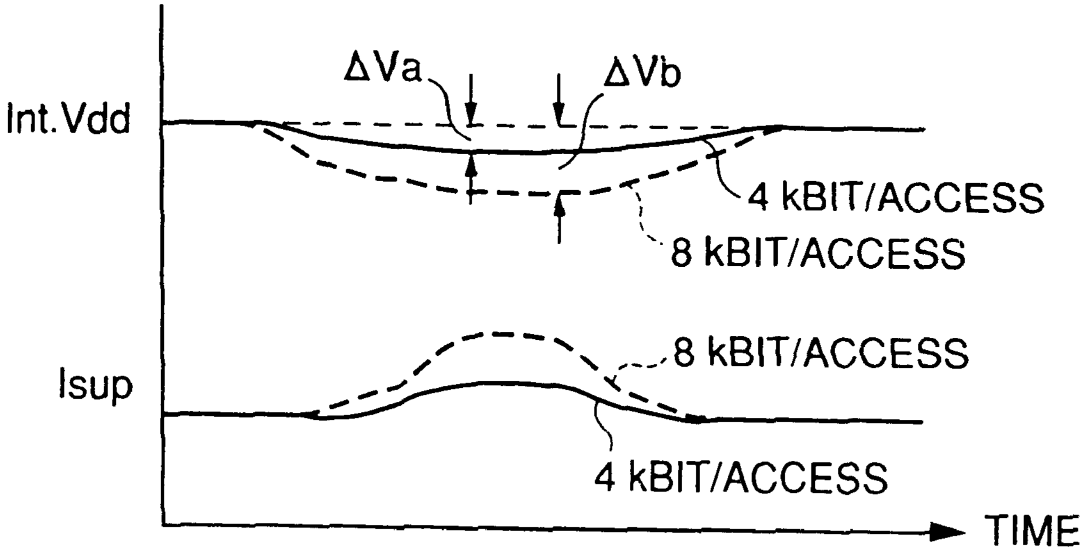
FIGS. 26A and 26B are conceptual graphs describing changes in load current corresponding to operating conditions of the semiconductor memory device.
Figure 26B:
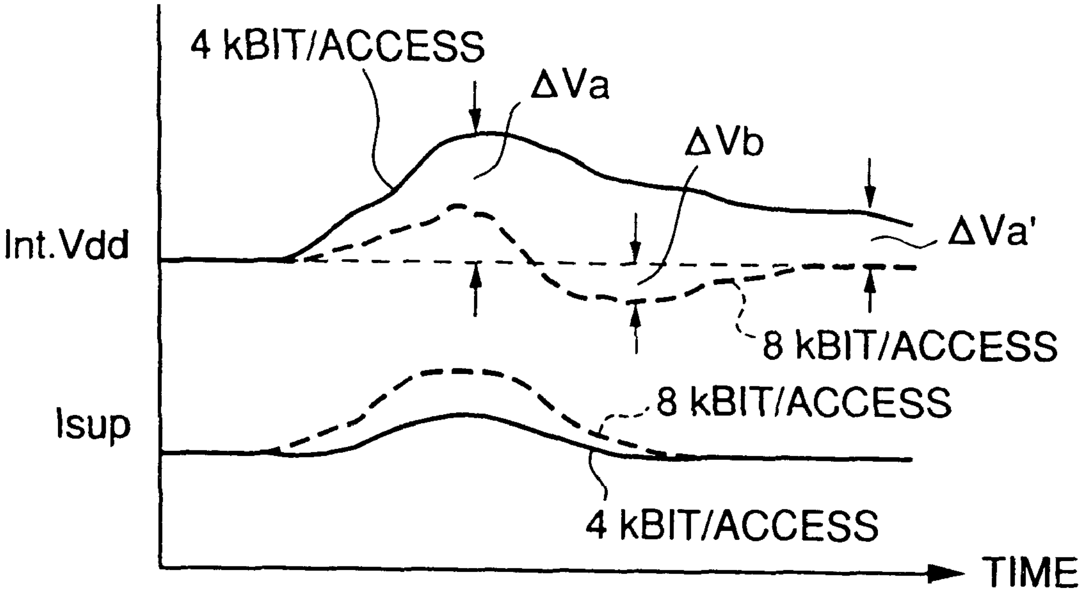

FIGS. 26A and 26B are conceptual graphs describing changes in load current corresponding to operating conditions.

In FIG. 26A, shown is a change in internal power supply potential int.Vdd in a case where no forced current supply is performed, the forced current supply being described in the first and second embodiments.

Referring to FIG. 26A, shown are changes in consumed current Iload and an internal power supply potential int.Vdd in cases of 4 kbits and 8 kbits in page size with a solid lines and dotted lines, respectively.

As shown in FIG. 26A, since as a page size increases, the number of datas amplified in a sense amplifier circuit increases, a consumed current Iload also increases. As a result, a drop ΔVb in internal power supply potential int.Vdd in a case of a page size of 8 kbits is larger than a drop ΔVa in the potential in a case of a page size of 4 kbits.

In FIG. 26B, shown is a change in internal power supply potential int.Vdd in a case where forced current supply is performed, which is described in the first and second embodiments.

In a case of FIG. 26B, forced current supply is performed to an internal power supply line 90 from an external power supply line 80 during a period corresponding to a period of current consumption in a load by activation of forced current supply control signals DRV and ZDRV.

When it is assumed that such forced current supply is suitable for a case of a page size of 8 kbits shown in FIG. 26A, a change in internal power supply potential int.Vdd in a case of a page size of 8 kits shown with dotted lines in FIG. 26B is in a good state as described in the first and second embodiments.

In a case of a page size of 4 kbits, a load current is small; therefore, forced current supply to the internal power supply line 90 results in overcharge of the internal power supply line 90. In such a way, when a current is supplied in excess, an overshooting ΔVa of the internal power supply potential int.Vdd is large. Furthermore, a problem arises since the overshooting ΔVa is not canceled even in a steady state and the internal power supply potential int.Vdd is constantly maintained at a higher level than the reference level Vref With such a constant overshot potential, an amount of power consumption increases and when the overshooting is large, a risk arises that results in failure of a circuit element.

Further, in the normal operation as shown in FIGS. 25A and 25B, while an internal power supply potential int.Vdd can be held without performing forced current supply when a page size is any of 4 kbits and 8 kbits, a case is considered in which forced current supply comes to be necessary for the first time in the fresh operation.

Figure 27:
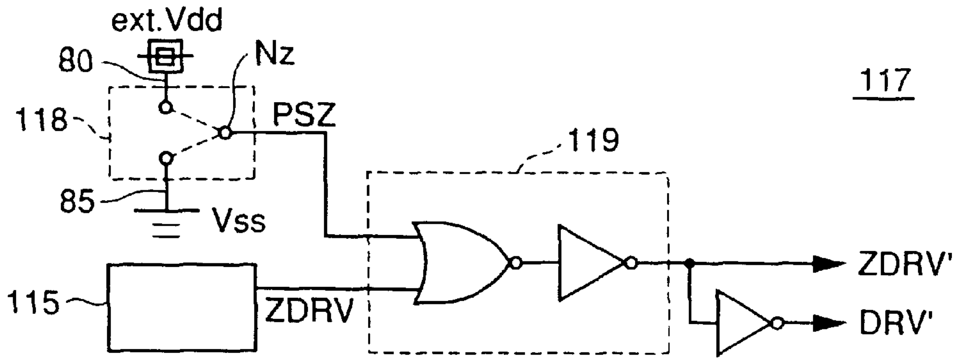
FIG. 27 is a circuit diagram representing a first example configuration of an internal power supply control circuit according to a third embodiment.

Referring to FIG. 27, an internal power supply control circuit 117 according to the third embodiment has a logic circuit 119 generating forced current supply control signals DRV' and ZDRV' in accordance to signal levels of a control signal ZDRV generated by the configuration of the internal power supply control circuit 115 described in the first embodiment and a page size setting signal PSZ.

In the third embodiment, each of the configurations of the internal power supply circuits described in the first and second embodiments, respectively, can be applied. In the third embodiment, an internal power supply circuit operates in response to forced current supply control signals DRV' and ZDRV' generated by an internal power supply control circuit 117 instead of control signals DRV and ZDRV generated by the internal power supply control circuit 115.

When a page size is 4 kbits, a page size setting signal PSZ is set to H level, while when a page size is 8 kbits, the page size setting signal PSZ is set to L level. A potential level of a mode signal PSZ is determined by formation of selective interconnection between a node Nz and each of an external power supply line 80 and a ground line 85 in an interconnection region 118. That is, the internal power supply control circuit shown in FIG. 27 corresponds to a case where a page size is set by switching over between masks in forming interconnection.

A control signal ZDRV generated by the configuration of the internal power supply control circuit 115 is a signal activated to L level in a period where forced current supply is performed; therefore, forced current supply can be selectively performed according to a page size, based on the result of an OR operation on a page size setting signal PSZ and a control signal ZDRV.

To be concrete, in a case where a page size is set to 4 kbits, a page size setting signal PSZ is fixed to H level; therefore, a potential level of a forced current supply control signal ZDRV' is always inactive at H level regardless of an output of the internal power supply control circuit 115 and thereby, no forced current supply in the internal power supply circuit is performed.

In contrast to this, in a case where a page size is 8 kbits and a signal level of a page size setting signal PSZ is at L level, a signal level of a control signal ZDRV is reflected direct on a forced current supply control signal ZDRV'.

Figure 28:
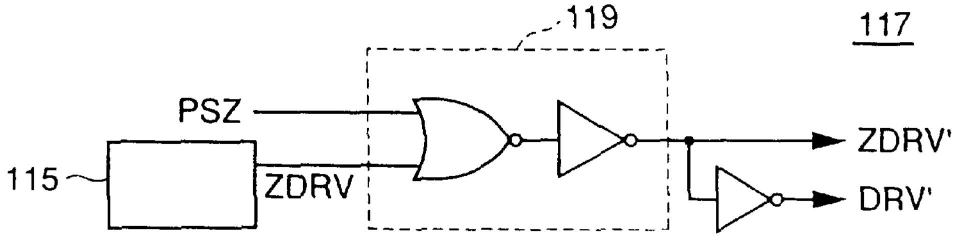
FIG. 28 is a circuit diagram representing a second example configuration of the internal power supply control circuit according to a third embodiment.

In FIG. 28, shown is a second configuration of the internal power supply control circuit according to the third embodiment. To be detailed, in FIG. 28, shown is a configuration of an internal power supply control circuit corresponding to a case where setting of a page size is switched over in response to an electric signal.

Referring to FIG. 28, setting of a page size can be switched over according to a signal level of a page size setting signal PSZ. The page size setting signal PSZ is set to H level in a case where a page size is 4 kbits, while the page size setting signal PSZ is set to L level in a case where a page size is 8 kbits, similar to the case described in FIG. 21.

An internal power supply control circuit 117 has a logic circuit 119 outputting the result of an OR operation on a control signal ZDRV outputted by the internal power supply control circuit 115 and a page size setting signal PSZ.

When an output of the logic circuit 119 and an inverted signal thereof are supplied to the internal power supply circuit as forced current supply control circuit ZDRV' and DRV', then an effect similar to the case of FIG. 27 can be obtained.

Figure 29:
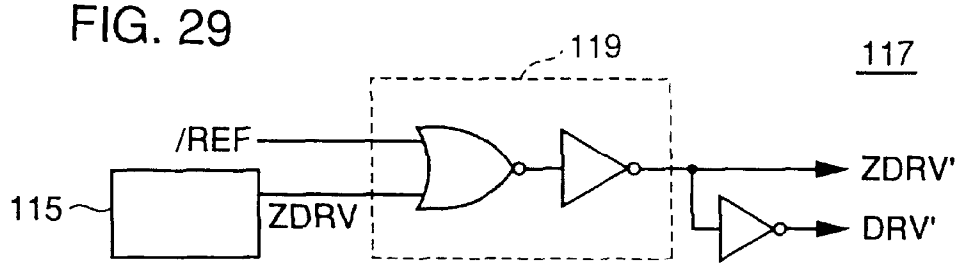
FIG. 29 is a circuit diagram representing a third example configuration of the internal power supply control circuit according to a third embodiment.

FIG. 29 represents a third example configuration of the internal power supply control circuit according to the third embodiment. In FIG. 29, shown is a configuration of an internal power supply control circuit for performing forced current supply corresponding to a refresh operation.

A circuit configuration of FIG. 29 is applied in a case where the number of datas as objects for one time row access is larger in the refresh operation than in the normal operation and while in the normal operation, an internal power supply potential int.Vdd can be held regardless of a page size without performing forced current supply; in the refresh operation, forced current supply becomes required.

Referring to FIG. 29, an internal power supply control circuit 117 includes: a logic circuit 119 outputting the result of an OR operation on a refresh mode signal /REF and a control signal ZDRV outputted by the internal power supply control circuit 115 as a forced current supply control signal ZDRV'.

The refresh mode signal /REF is a signal indicating whether an operating mode of a semiconductor device is of the normal operation or of the refresh operation. To be detailed, the refresh mode signal /REF is inactivated to H level in the normal operation, while the signal is activated to L level in the refresh operation.

Accordingly, in the normal operation, a forced current supply control signal ZDRV' is inactivated to H level at all times regardless of a signal level of a control signal ZDRV and no forced current supply is performed in the internal power supply circuit.

On the other hand, in the refresh operation, a signal level of a forced current supply control signal ZDRV' is set to a value corresponding to a control signal ZDRV generated by the configuration of the internal power supply control circuit 115 in correspondence to activation to L level of a refresh mode signal /REF. By doing so, forced current supply is performed in the internal power supply circuit in the timing matching with a period of current consumption of a load.

With such a configuration, in the normal operation where a potential level of the internal power supply potential int.Vdd can be held without performing forced current supply, rise in potential level caused by overcharge of the internal power supply line 90 is prevented from occurring, and in the fresh operation where a consumed current is large, a potential level of the internal power supply potential int.Vdd can be maintained in a good state without providing a large stabilization capacitance.

Figure 30:
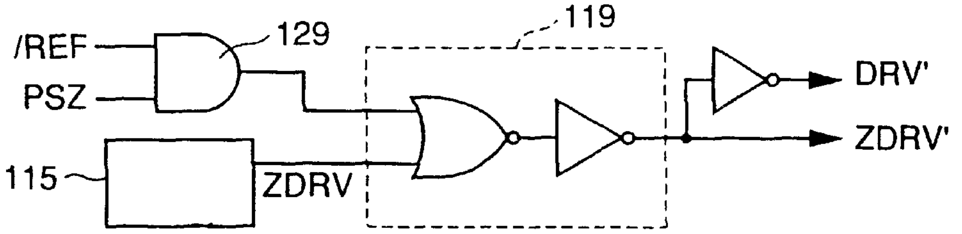
FIG. 30 is a circuit diagram representing a fourth example configuration of the internal power supply control circuit according to a third embodiment.

FIG. 30 represents a fourth example configuration of the internal power supply control circuit according to the third embodiment. In FIG. 30, shown is a configuration of an internal power supply control circuit capable of selecting whether of not forced current supply is performed according to a page size and an operating mode.

Referring to FIG. 30, the internal power supply control circuit 125 includes: a logic gate 129 performing a logic operation on a page size setting signal PSZ and a refresh mode signal /REF; and a logic circuit 119 performing a logic operation on an output of the logic gate 129 and a control signal ZDRV outputted from a configuration corresponding to an internal power supply control circuit 115.

None of descriptions will be repeated of signal levels of the page size setting signal PSZ and the refresh mode signal /REF since descriptions thereof are similar to those in FIGS. 27 to 29.

That is, when an output of the logic gate 129 is set to H level, a forced current supply control signal ZDRV' is inactivated (H level) regardless of a signal level of a control signal ZDRV and no forced current supply in the internal power supply circuit is performed. It is limited to when a refresh mode signal /REF is at H level, that is in the normal operating mode, and in addition, a page size setting signal PSZ is at H level, that is a page size is 4 kbits that an output of the logic gate 129 is set to H level. In such a way, a rise in internal power supply potential int.Vdd caused by overcharge of the internal power supply line is suppressed in an operating condition where a consumed current is judged to be small based on an operating mode and a page size, without performing forced current supply.

On the other hand, in a case where a refresh mode signal /REF is set to L level, that is a refresh operation is performed, or alternatively, in a case where a page size is as large as 8 kbits in the normal operation, that is in an operating condition where a consumed current of a sense amplifier, which is a load, is large; then forced current supply control signals ZDRV' and DRV' are activated during a period corresponding a period of current consumption of a load; thereby enabling maintenance of a potential level of an internal power supply potential int.Vdd in a good state.

In such a way, according to the configuration of the internal power supply control circuit according to the third embodiment, whether or not forced current supply in an internal power supply circuit is performed can be selected according to a page size or an operating condition of a semiconductor memory device represented by an operating mode. By doing so, not only can a drop in internal power supply potential int.Vdd caused by an influence of a load current be prevented from occurring in an operating condition where a consumed current is large, but overcharge of the internal power supply line is also prevented from occurring and thereby an overshooting of an internal power supply potential int.Vdd can be suppressed, in an operating condition where a consumed current is small.

It should be appreciated that in the third embodiment, a magnitude of a consumed current in a sense amplifier, which is a load, is judged based on a page size and an operating mode (the normal operation or the refresh operation), while in a case an internal power supply potential int.Vdd is supplied to another internal circuit as a load, a configuration has only to be adopted in which whether or not forced current supply in the internal power supply circuit is performed is selected based on proper other operating conditions.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a memory cell array having a plurality of memory cells arranged in a matrix pattern;

a plurality of word lines provided corresponding to respective rows of said memory cells, at least one of said plurality of word lines being selectively activated in response to activation of a first control signal;

a plurality of bit line pairs provided corresponding to respective columns of memory cells, each bit line pair transmitting data held in a memory cell corresponding to an activated word line;

a plurality of sense amplifier circuits provided corresponding to said respective plurality of bit line pairs, each sense amplifier circuit amplifying a potential level difference occurring between bit lines constituting a corresponding one of said plurality of bit line pairs in response to activation of a second control signal; and a power supply circuit converting an external power supply potential into an internal power supply potential, said power supply circuit includes:

an external power supply line supplying said external power supply potential;

an internal power supply line coupled, at least, to said sense amplifier to supply said internal power supply potential to said sense amplifier;

a potential difference amplifying circuit amplifying a potential level difference between said internal power supply potential and a reference potential to supply the amplified potential level difference to a control node;

a current supply circuit for supplying a supply current amount according to a potential level of said control node to said internal power supply line from said external power supply line; and a forced current supply control circuit for forcibly performing current supply to said internal power supply line from said external power supply line, regardless of said potential level difference, according to said first and second control signals, said forced current supply control circuit forcibly performing said current supply during a prescribed period from a first time point determined in response to activation of said first control signal till a second time point determined in response to activation of said second control signal.

2. The semiconductor memory device according to claim 1, wherein said forced current supply control circuit includes a forced current supply period control circuit activating a forced current supply control signal during said prescribed period, wherein said forced current supply period control circuit ceases activation of said forced current supply control signal in said prescribed period according to a consumed current amount corresponding to an operating condition of said semiconductor memory device.

3. The semiconductor memory device according to claim 2, wherein said forced current supply period control circuit ceases activation of said forced current supply control signal in said prescribed period according to the number of memory cells as an object of a one time row access operation.

4. The semiconductor memory device according to claim 2, wherein the number of memory cells as an object of a one time row access operation is larger in a refresh operation than in a normal operation and said forced current supply period control circuit ceases activation in said prescribed period of said forced current supply control signal in said normal operation and performs activation in said prescribed period of said forced current supply control signal in said refresh operation.

5. The semiconductor memory device according to claim 2, wherein the number of memory cells as an object of a one time row access operation is larger in a refresh operation than in a normal operation and said forced current supply period control circuit ceases activation in said prescribed period of said forced current supply control signal in a case where said operating condition is said normal operation and the number of memory cells as an object of a one time row access operation in said normal operation is set to a number smaller than a prescribed number.

6. The semiconductor memory device according to claim 1, wherein said forced current supply control circuit includes a forced current supply period control circuit activating a forced current supply control signal during said prescribed period, said forced current supply period control circuit activates said forced current supply control signal in advance of activation of said first control signal.

7. The semiconductor memory device according to claim 1, wherein said forced current supply control circuit includes a forced current supply period control circuit activating a forced current supply control signal during said prescribed period, said forced current supply control circuit inactivates said forced current supply control signal in advance of inactivation of said first control signal.

8. The semiconductor memory device according to claim 1, wherein said forced current supply control circuit includes a forced current supply period control circuit activating a forced current supply control signal during a period from said first time point till which a first delay time elapses from activation of said second control signal, till said second time point till which a second delay time elapses from activation of said first control signal, and said forced current supply period control circuit includes:

first and second delay circuits for setting said first and second delay times, respectively, each of said first and second delay circuits having:

a plurality of internal nodes for transmitting a signal;

a plurality of transistors for transmitting said signal between said plurality of internal nodes; and at least one of a delay resistance and a delay capacitance, electrically coupled to at least one of said plurality of internal nodes, wherein a signal propagation delay caused by said at least one of a delay resistance and a delay capacitance is larger than a signal propagation delay caused by said plurality of transistors.

9. The semiconductor memory device according to claim 1, wherein said forced current supply control circuit includes:

a forced current supply period control circuit activating a forced current supply control signal during said prescribed period; and a forced adjustment circuit connected to said potential difference amplifying circuit, wherein said forced adjustment circuit forcibly alters a potential level outputted onto said control node by said potential difference amplifying circuit in a direction of increase in said supply current amount in response to activation of said forced current supply control signal.

10. The semiconductor memory device according to claim 1, wherein said forced current supply control circuit includes:

a forced current supply period control circuit activating a forced current supply control signal during said prescribed period; and a forced adjustment circuit connected between a power supply node transmitting a potential level of said control node at which level said supply current amount is maximal and said control node, wherein said forced adjustment circuit couples said control node and said power supply node to each other in response to activation of said forced current supply control signal.

11. The semiconductor memory device according to claim 1, wherein said forced current supply control circuit includes:

a forced current supply period control circuit activating a forced current supply control signal during said prescribed period; and a forced adjustment circuit provided between said external power supply line and said internal power supply line to supply a prescribed current amount to said internal power supply line from said external power supply line in response to activation of said forced current supply control signal.

* * * * *